United States Patent [19]

Masuoka

[11] Patent Number: 4,803,529

[45] Date of Patent: Feb. 7, 1989

[54] ELECTRICALLY ERASABLE AND ELECTRICALLY PROGRAMMABLE READ ONLY MEMORY

[75] Inventor: Fujio Masuoka, Yokohama, Japan

[73] Assignee: Tokyo Shibaura Denki Kabushiki Kaisha, Kawasaki, Japan

[21] Appl. No.: 321,322

[22] Filed: Nov. 13, 1981

[30] Foreign Application Priority Data

| Nov. 20, 1980 | [JP] | Japan | 55-163931 |
| Nov. 20, 1980 | [JP] | Japan | 55-163932 |
| Nov. 20, 1980 | [JP] | Japan | 55-163933 |
| Nov. 29, 1980 | [JP] | Japan | 55-168616 |
| Nov. 29, 1980 | [JP] | Japan | 55-168617 |
| Nov. 29, 1980 | [JP] | Japan | 55-168618 |
| Nov. 29, 1980 | [JP] | Japan | 55-168619 |
| Nov. 29, 1980 | [JP] | Japan | 55-168620 |
| Dec. 20, 1980 | [JP] | Japan | 55-180951 |
| Jan. 21, 1981 | [JP] | Japan | 56-7558 |
| Jul. 30, 1981 | [JP] | Japan | 56-119782 |

[51] Int. Cl.[4] .................... H01L 29/78; H01L 27/02; G11C 11/40

[52] U.S. Cl. .................... 357/23.5; 357/41; 365/185

[58] Field of Search .................... 357/23.5, 41

[56] References Cited

U.S. PATENT DOCUMENTS

| 3,825,945 | 7/1974 | Masuoka . | |
| 3,825,946 | 7/1974 | Frohman-Bentchkowsky | 357/23.5 |
| 4,099,196 | 7/1978 | Simko | 357/23 |
| 4,119,995 | 10/1978 | Simko | 357/23 |
| 4,203,158 | 5/1980 | Frohman-Bentchkowsky et al. | 365/185 |
| 4,267,558 | 5/1981 | Guterman | 357/23.5 |
| 4,274,012 | 6/1981 | Simko | 357/23.5 |
| 4,302,766 | 11/1981 | Guterman et al. | 357/23.5 |
| 4,314,265 | 2/1982 | Simko | 357/23.5 |
| 4,331,968 | 5/1982 | Gosney et al. | 357/23.5 |
| 4,531,203 | 7/1985 | Masuoka et al. | 357/23.5 |
| 4,561,004 | 12/1985 | Kuo et al. | 357/23.5 |

OTHER PUBLICATIONS

Hoffman, "Floating Gate Nonvolatile Memory Cell", IBM Technical Disclosure Bulletin, vol. 22, No. 6 (Nov. 1979).
Japanese Patent No. 52-13782.
1980 IEEE International Solid-State Circuit Conference 152 (Feb. 1980), A 16Kb Electrically Erasable Nonvolatile Memory.

Primary Examiner—Gene M. Munson
Attorney, Agent, or Firm—Finnegan, Henderson, Farabow, Garrett and Dunner

[57] ABSTRACT

A semiconductor memory device having a MOS transistor with a floating gate capable of storing data.

The MOS transistor has an erase gate which overlaps part of the floating gate with an insulating film interposed therebetween. Upon application of a high voltage on the erase gate, the field emission is caused between the floating gate and the erase gate and the charge stored on the floating gate is removed.

29 Claims, 26 Drawing Sheets

F I G. 13E
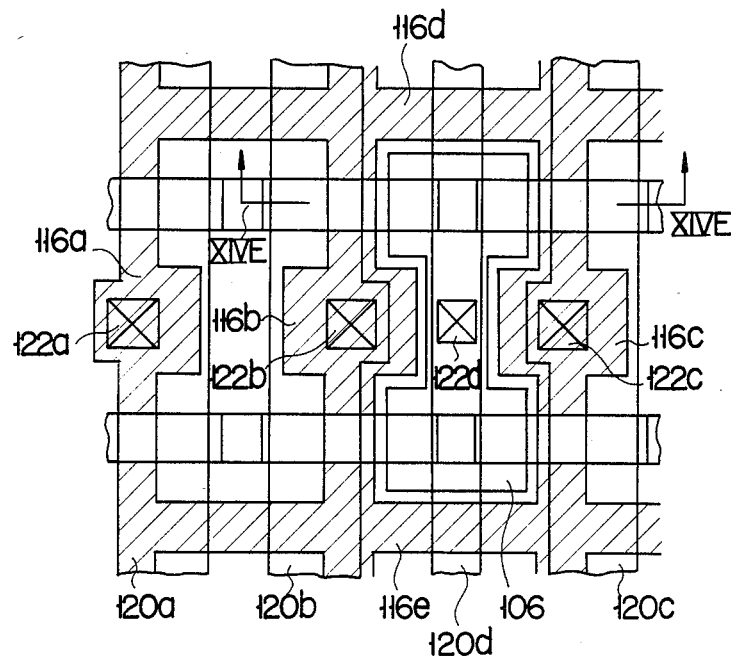
F I G. 15
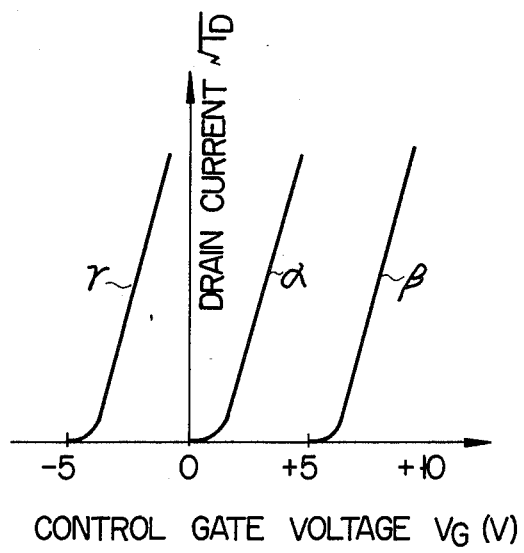

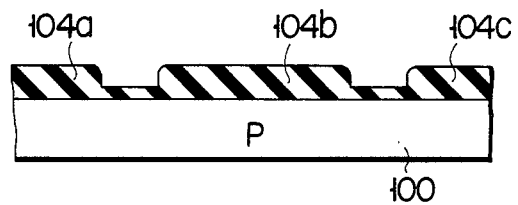
F I G. 14A
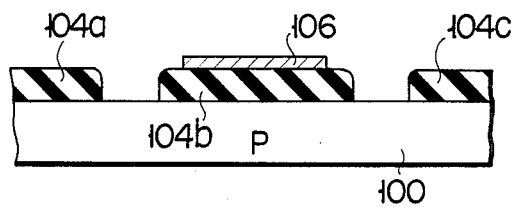
F I G. 14B
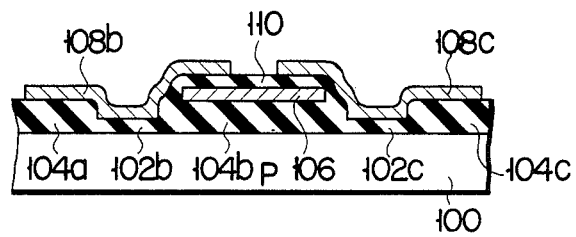
F I G. 14C
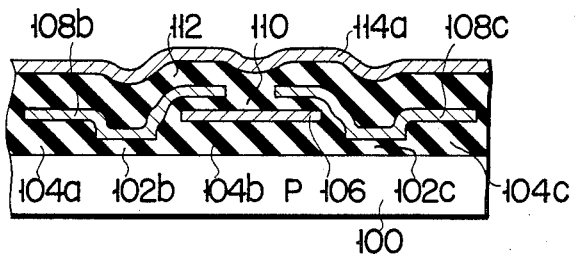
F I G. 14D
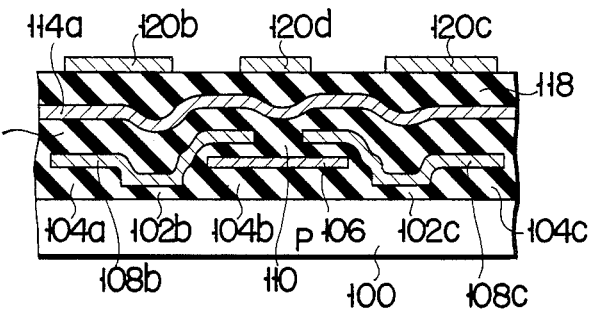
F I G. 14E F I G. 16
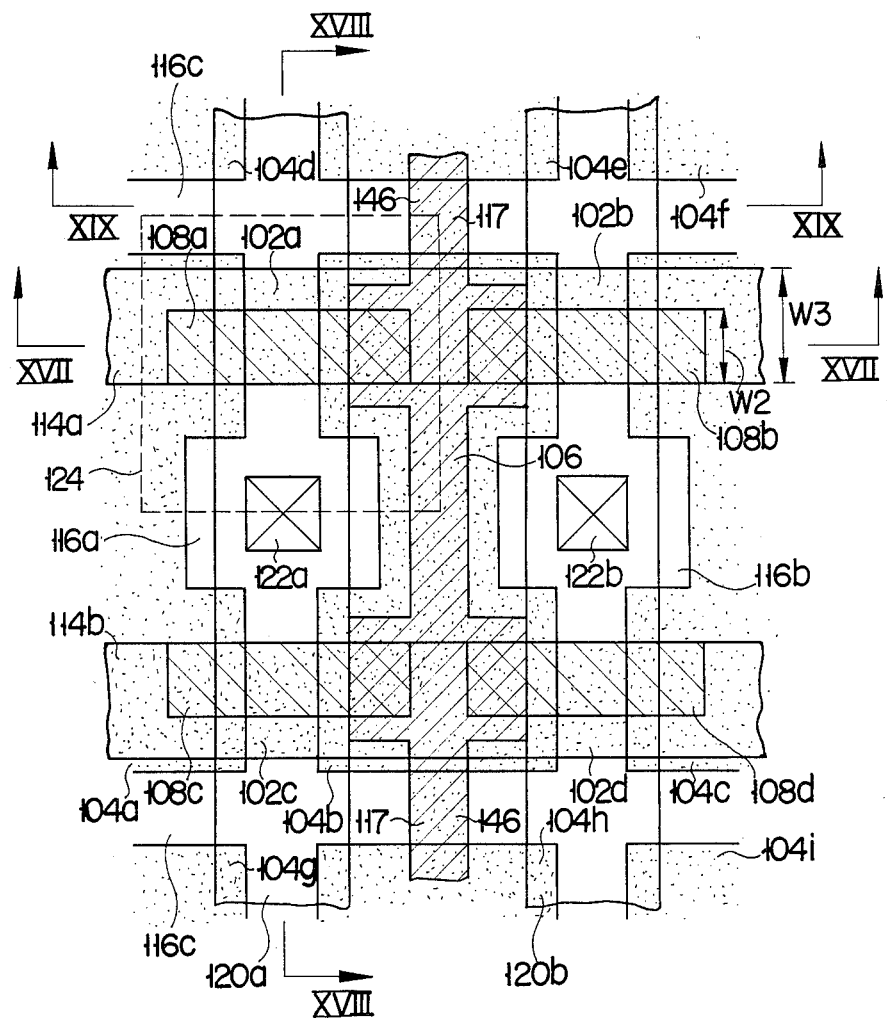

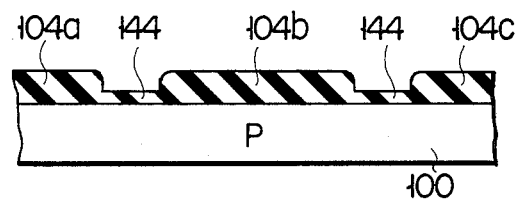
F I G. 22A
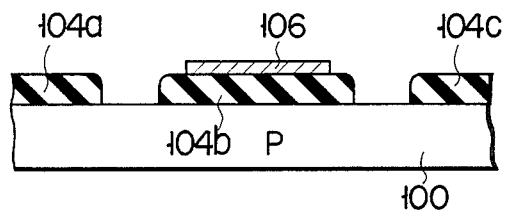
F I G. 22B
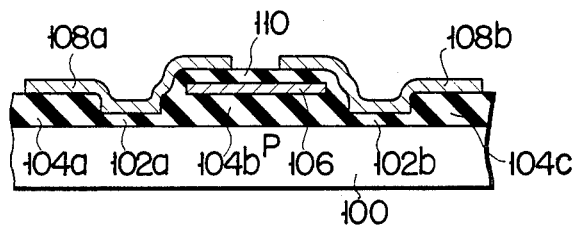
F I G. 22C
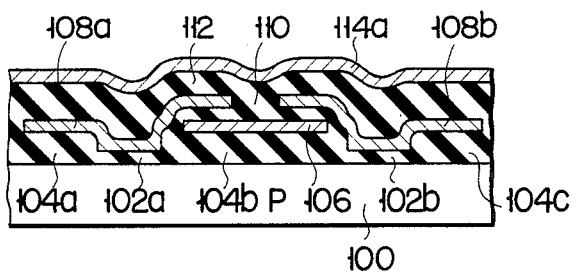
F I G. 22D
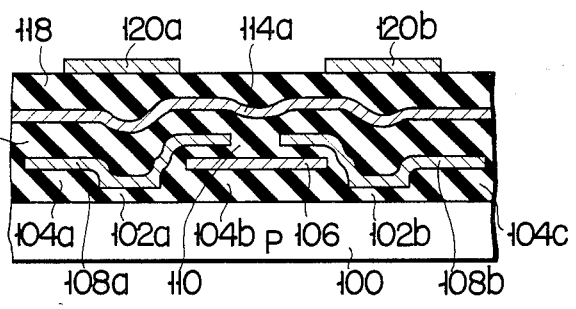
F I G. 22E F I G. 23
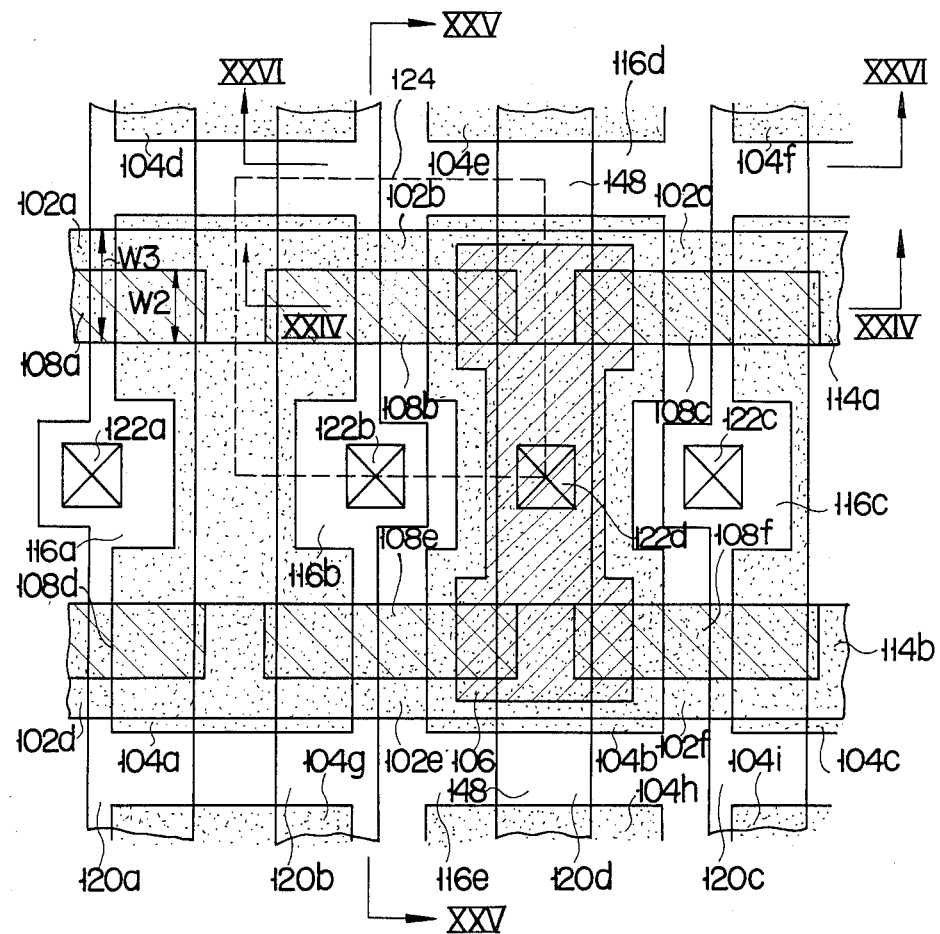

F I G. 24
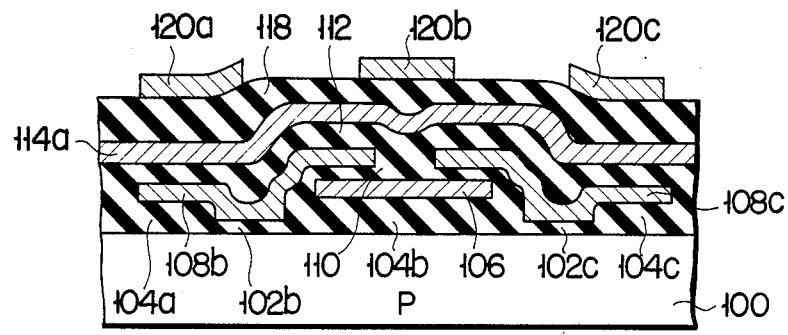
F I G. 25
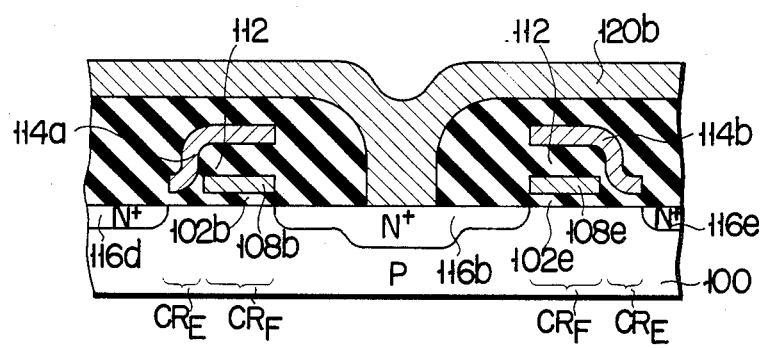
F I G. 26
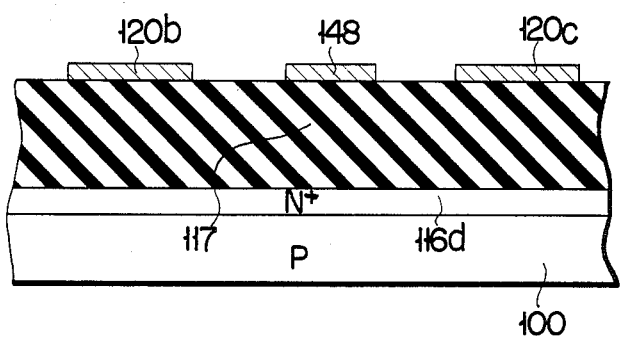

F I G. 27C
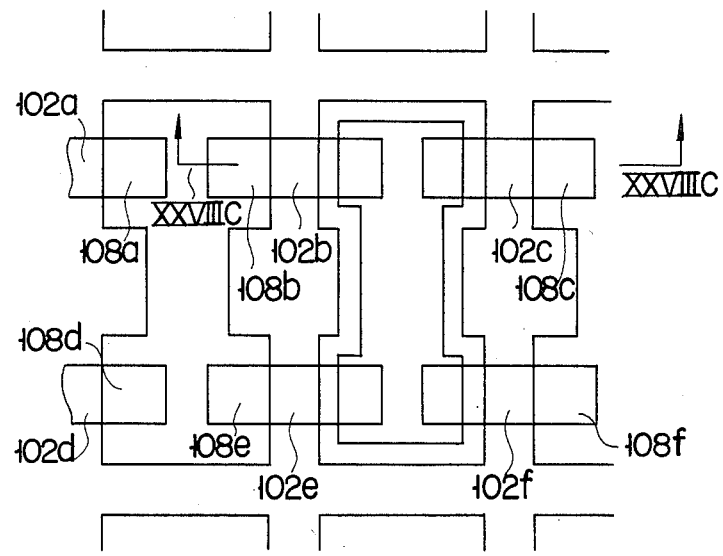
F I G. 27D
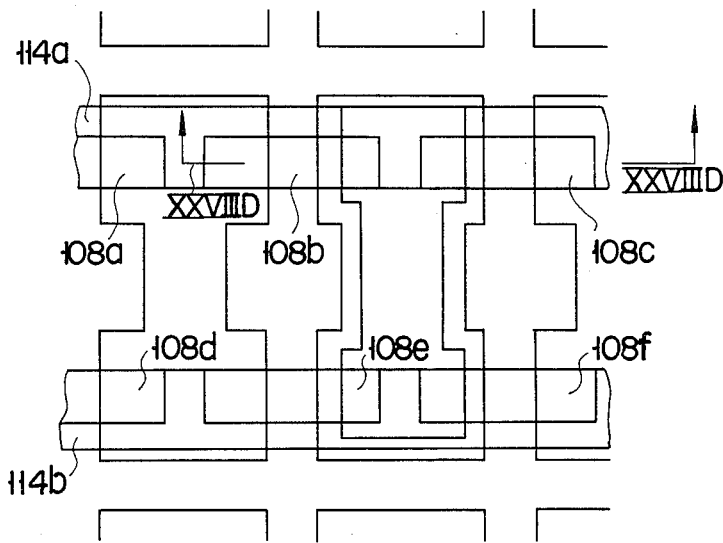

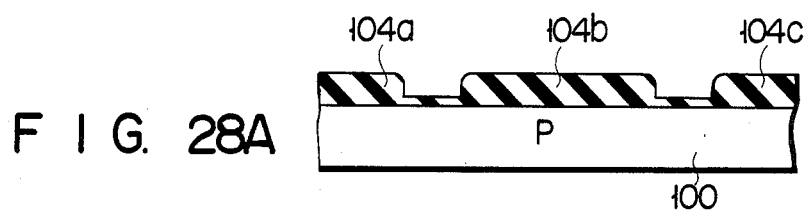
F I G. 28A
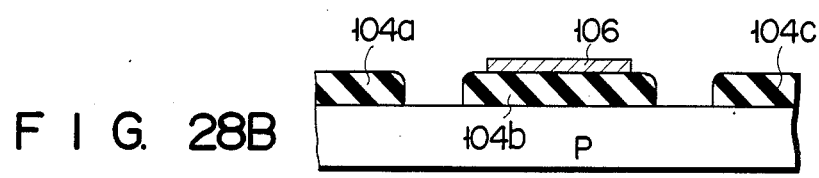
F I G. 28B
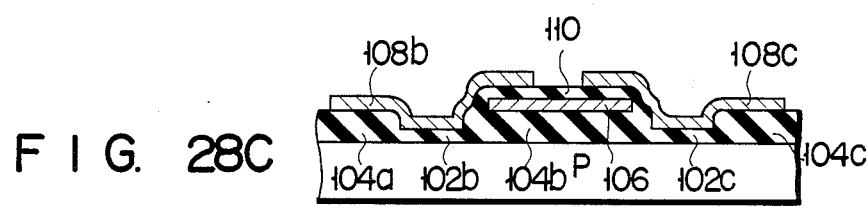
F I G. 28C
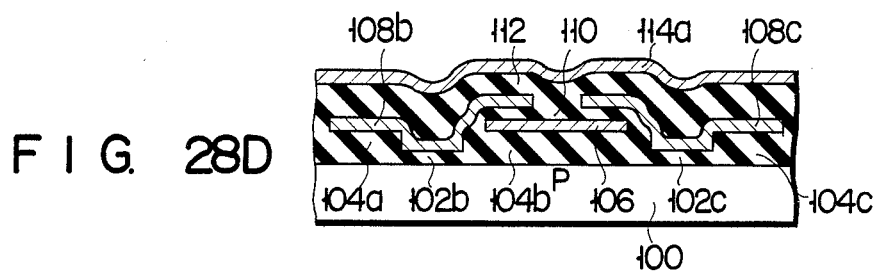
F I G. 28D
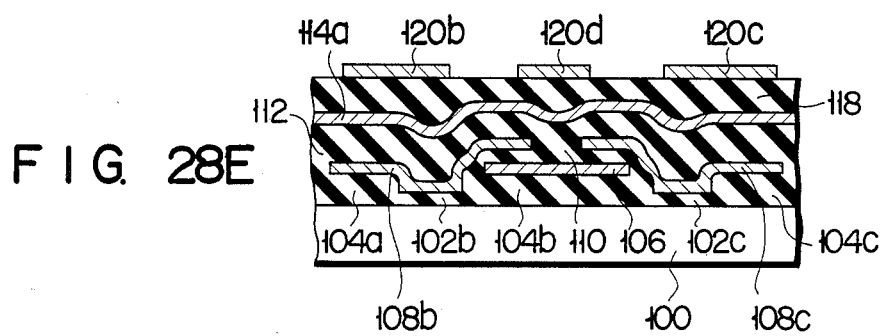
F I G. 28E

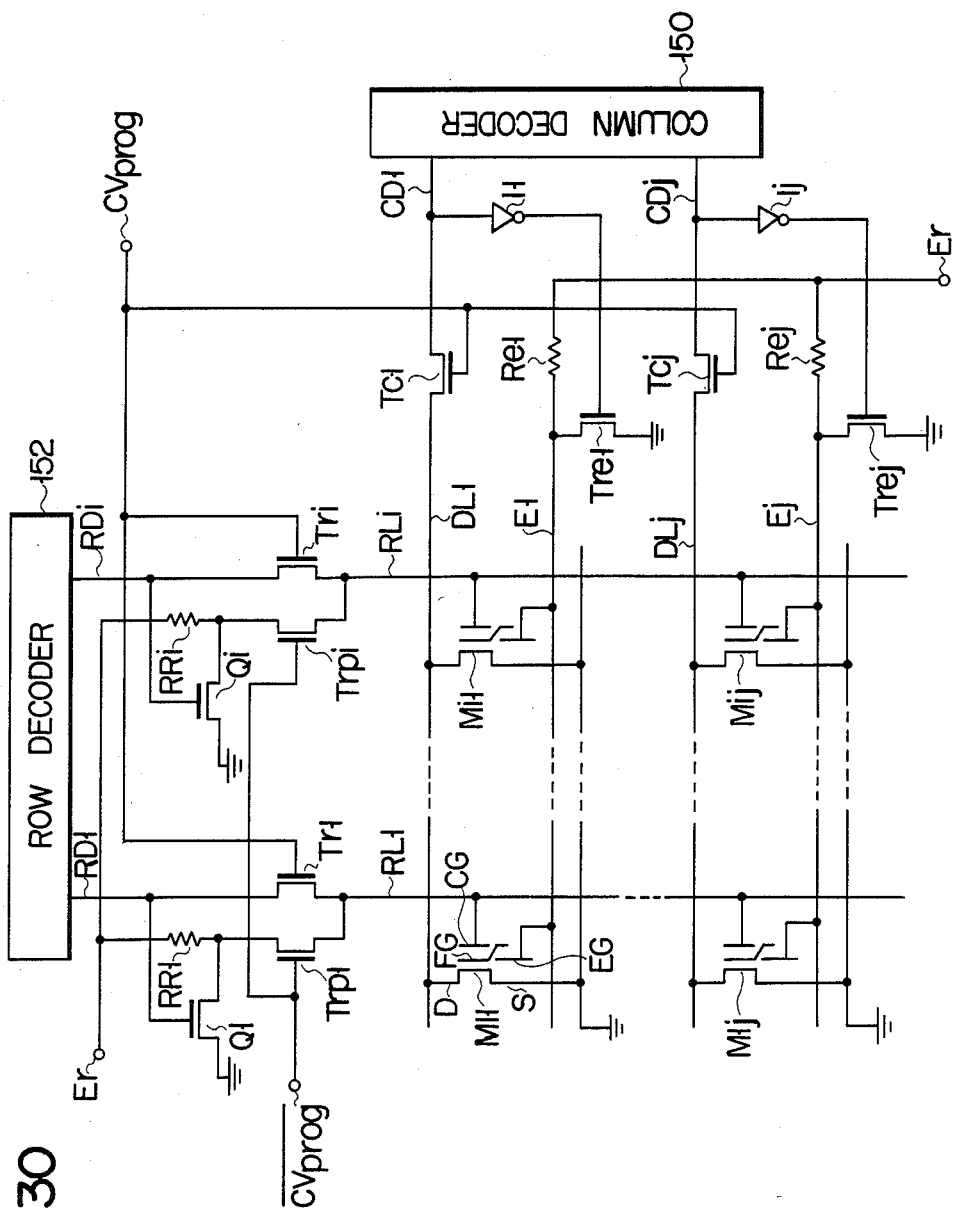
F I G. 30

ELECTRICALLY ERASABLE AND ELECTRICALLY PROGRAMMABLE READ ONLY MEMORY

BACKGROUND OF THE INVENTION

The present invention relates to a semiconductor memory device suitable for an electrically erasable and electrically programmable read-only memory.

Writing and erasing of data after manufacture is possible with an erasable and electrically programmable read-only memory (EP-ROM). The EP-ROMs are roughly classified into the ultraviolet ray erasable type and into the electrically erasable type. A high packaging density may be accomplished with an EP-ROM of the ultraviolet ray erasable type, since one transistor may comprise one memory cell. The ultravoilet ray erasable type EP-ROMs of 32kbit and 64kbit have been developed so far. However, the EP-ROMs of the ultraviolet ray erasable type are defective in that manufacturing cost becomes high since a package is required which transmits the ultravoilet rays. On the other hand, a satisfactory packaging density may not be accomplished with the electrically erasable and programmable read-only memory ($E^2P$-ROM) since at least two transistors constitute one memory cell. $E^2P$-ROMs of 16kbit have so far been developed. However, the $E^2P$-ROMs of the electrically erasable type are advantageous in that manufacturing costs may be reduced by using a less expensive plastic material for the package. conventional $E^2P$-ROM disclosed in "A 16 kb Electrically Erasable Nonvolatile Memory", ISSCC Digest of Technical Papers, 1980, Feb. pp 152 to 153 and 271 by W. S. Johnson et al. This memory cell comprise two transistors Q1 and Q2. The transistor Q1 comprises a select MOS transistor and the transistor Q2 comprises a double gate type MOS transistor having a control gate 50 and a floating gate 52. One doped region of the transistor Q1 is connected to a digit line 54, and the other doped region thereof is connected to one doped region of the transistor Q2. The gate of the transistor Q1 is connected to a select line 56. The other doped region of the transistor Q2 is grounded, and the control gate thereof is connected to a data program line 58.

The conventional $E^2P$-ROMs of the construction as described above have the following drawbacks:

(a1) As may be apparent from FIG. 1, one memory cell comprises two transistors. Therefore, the number of elements becomes twice that of the EP-ROMs of the ultraviolet ray erasable type, resulting in half the packaging density. The EP-ROMs of the electrically erasable type are inferior in the packaging density to those of the ultravoilet ray erasable type.

(a2) Voltages of both polarities of positive and negative are required for writing and erasing of data. Therefore, power sources of both polarities of positive and negative are required for mounting the $E^2P$-ROMs of this type on a printed circuit board and for electrically writing and erasing data therein.

(a3) Extra circuits are required to simultaneously erase data in units of words or all the bits, resulting in a low packaging density.

(a4) It is difficult to erase data of all the bits within a short period of time.

(a5) It is impossible to erase data with a unipolar power source of 5V, for example.

SUMMARY OF THE INVENTION

It is the first object of the present invention to provide a highly integrated semiconductor memory device.

It is the second object of the present invention to provide a semiconductor memory device with which data may be erased with high efficiency and at a high speed.

It is the third object of the present invention to provide a semiconductor memory device which is capable of operating normally even when an erratic erasing operation is performed during the erasure of data.

It is the fourth object of the present invention to provide a semiconductor memory device which is capable of writing data with high efficiency and quantitatively detecting the data writing condition of the memory cell.

It is the fifth object of the present invention to provide a semiconductor memory device which is capable of effectively erasing data and of quantitatively detecting the writing condition of data.

In order to achieve the above and other objects, there is provided according to the present invention a semiconductor memory device which has a floating gate capable of storing data and an erase gate which overlaps part of the floating gate with an insulating film so as to remove the charge on the floating gate interposed therebetween.

With the erase gate of the above construction, one memory cell may comprise only one transistor, so that the packaging density may be improved over the conventional $E^2P$-ROMs.

Furthermore, since a transistor for selecting the bit is not necessary unlike in the case of a conventional $E^2P$-ROM, the data may be readily erased in units of words or all the bits. Since field emission is utilized for erasing data, the data may be erased within a short period of time.

If the size of the floating gate along the direction of channel is shorter than the channel length and the size of the control gate along the direction of channel is equal to or more than the channel length, data may be normally read out even when the extra data is erased during the erasing of data and the MOS transistor becomes a depletion type.

If the semiconductor memory device is formed to satisfy the relation $$C_{FC} > C_{FE} \geq C_{FC}/5$$

where $C_{FE}$ is the capacitance between the erase gate and the floating gate and $C_{FC}$ is the capacitance between the floating gate and the control gate, writing of data may be performed with efficiency and the charge on the floating gate may be detected with efficiency.

If, on the other hand, a semiconductor memory device is formed to satisfy the relation $$5C_{FE} \geq C_{FC} \geq 2C_{FB}$$

where $C_{FE}$ is the capacitance between the erase gate and the floating gate, $C_{FC}$ is the capacitance between the floating gate and the control gate, and $C_{FB}$ is the capacitance between the floating gate and the semiconductor region, erasing of data may be performed with efficiency and writing of data may be quantitatively detected.

BRIEF DESCRIPTION OF THE DRAWINGS

Other objects and advantages of the invention will become apparent from the following detailed description when taken in conjunction with the accompanying drawings in which:

FIGS. 13A to 13E are plan views of the semiconductor substrate for explaining the method for manufacturing the semiconductor memory device according to the second embodiment of the present invention;

FIGS. 14A to 14E are sectional views along the lines XIVA—XIVA, XIVB—XIVB, . . . XIVE—XIVE, respectively, of FIGS. 13A to 13E;

FIG. 15 is a graph showing the relationship between the control gate voltage VG and the drain current $\sqrt{D}$ of a MOS transistor storing various data on the floating gate;

FIG. 16 is a plan view of the third embodiment of the semiconductor memory device of the present invention;

FIGS. 22A to 22E are sectional views along the lines XXIIA—XXIIA, XXIIB—XXIIB, . . . XXIIE—XXIIE, respectively, of FIGS. 21A to 21E;

FIG. 23 is a plan view of the fourth embodiment of the semiconductor memory device of the present invention;

FIG. 24 is a sectional view along the line XXIV—XXIV of FIG. 23;

FIG. 25 is a sectional view along the line XXV—XXV of FIG. 23;

FIG. 26 is a sectional view along the line XXVI—XXVI of FIG. 23;

FIGS. 27A to 27E are plan views of the semiconductor substrate for explaining the method for manufacturing the semiconductor memory device according to the fourth embodiment of the present invention;

FIGS. 28A to 28E are sectional views along the lines XXVIIIA—XXVIIIA, XXVIIIB—XXVIIIB, . . . XXVIIIE—XXVIIIE, respectively, of FIGS. 27A to 27E;

FIG. 30 is a circuit diagram of a semiconductor memory device of i×j bits which uses the memory cells according to the present invention and which is capable of writing and erasing of data in units of bits.

DETAILED DESCRIPTION OF THE PREFERRED EMBODIMENTS

Figure 2:
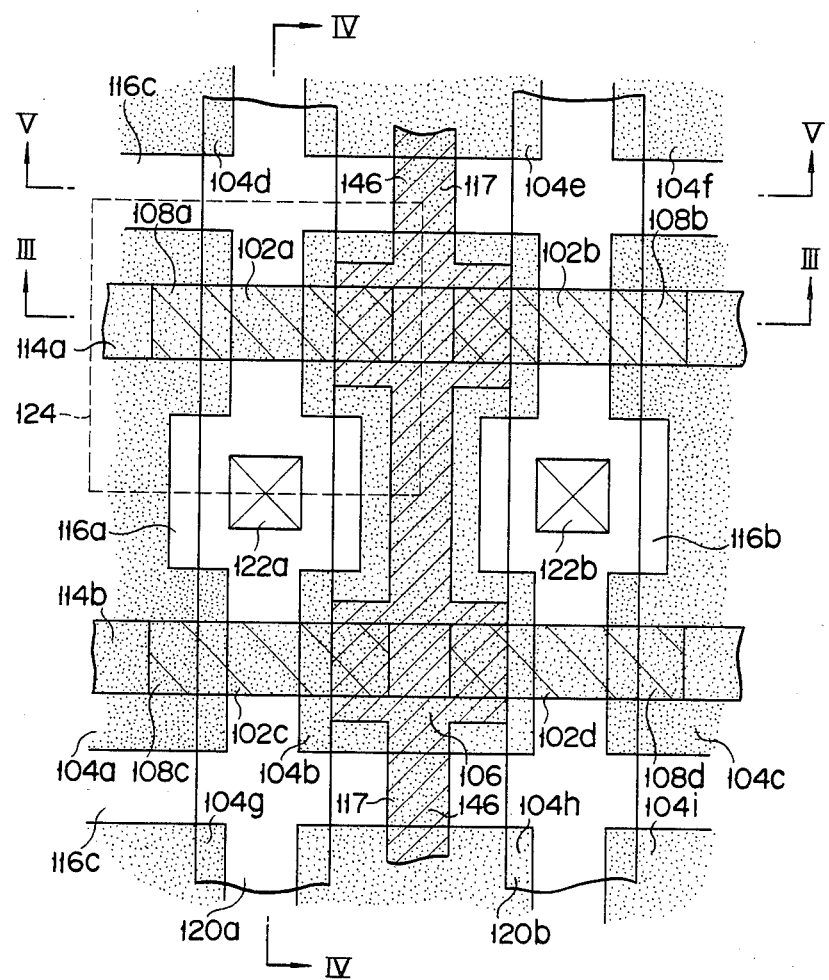
FIG. 2 is a plan view of the first embodiment of a semiconductor memory device of the present invention.
Figure 3:
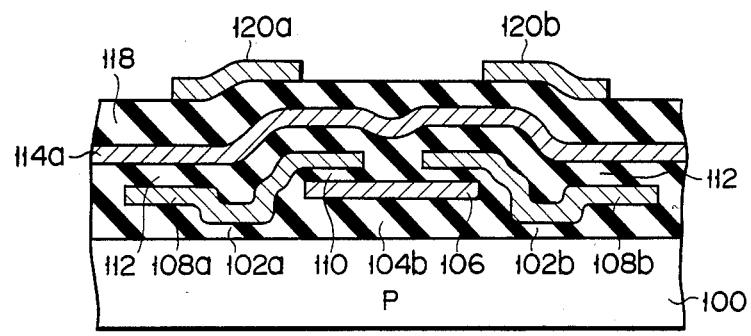
FIG. 3 is a sectional view along the line III—III of FIG. 2.
Figure 4:
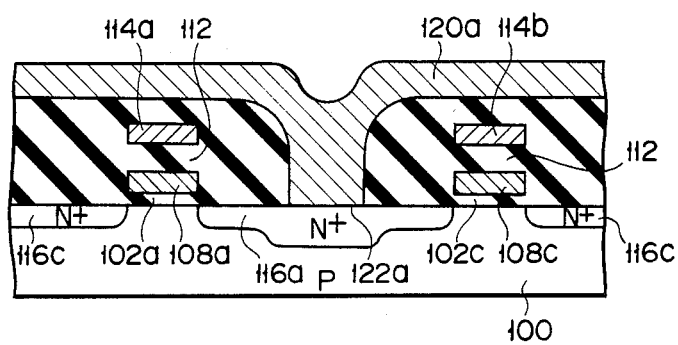
FIG. 4 is a sectional view along the line IV—IV of FIG. 2.
Figure 5:
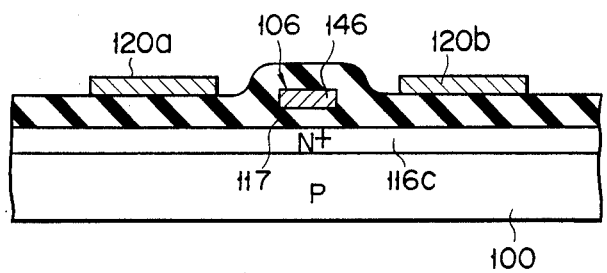
FIG. 5 is a sectional view along the line V—V of FIG. 2.

The first embodiment of the semiconductor memory device of the present invention will be described with reference to FIGS. 2 to 5 wherein FIG. 2 is a plan view of memory cells for 4 bits, FIG. 3 is a sectional view along the line III—III of FIG. 2, FIG. 4 is a sectional view along the line IV—IV of FIG. 2, and FIG. 5 is a sectional view along the line V—V of FIG. 2. Referring to FIG. 2, the doped regions of the semiconductor substrate are indicated by the clear areas, the oxide areas are indicated by the dotted areas, and the polycrystalline silicon members are indicated by the cross-hatched areas. Gate insulating films 102a, 102b, 102c and 102d of 500 Å thickness each are formed on the surface of a P-type semiconductor substrate 100 with equal intervals in an X-Y matrix form. On the surface of the semiconductor substrate 100 are also formed field insulating films 104a, . . . 104i. The field insulating film 104b of 1 μ thickness is formed between the paired gate insulating films 102a and 102c and the paired gate insulating films 102b and 102d. A first conductive layer 106 which has a thickness of 6,000 Å and which consists of polycrystalline silicon doped with phosphorus or arsenic is formed on the field insulating film 104b. Second conductive layers 108a, 108b, 108c and 108d which have a thickness of 5,000 Å and which consist of polycrystalline silicon are formed on the gate insulating films 102a, 102b, 102c and 102d, respectively, and are separate from one another. The right edges of the second conductive layers 108a and 108c overlap the left edge of the first conductive layer 106 with an insulating film 110 of 500 Å thickness interposed therebetween. The left edges of the second conductive layers 108b and 108d overlap the right edge of the first conductive layer 106 with this insulating film 110 interposed therebetween. A third conductive layer 114a of polycrystalline silicon is formed on the second conductive layers 108a and 108b with an insulating film 112 having a thickness of 1,000 to 2,000 Å interposed therebetween. The third conductive layer 114a has substantially the same width as those of the second conductive layers 108a and 108b. Another third conductive layer 114b of polycrystalline silicon is formed on the other second conductive layers 108c and 108d with the insulating film 112 interposed therebetween. This third conductive layer 114b also has substantially the same width as those of the second conductive layers 108c and 108d. An N+-type semiconductor layer 116a is formed on the surface region of the semiconductor substrate 100 disposed between the gate insulating films 102a and 102c. Another N+-type semiconductor layer 116b is formed on the surface region of the semiconductor substrate 100 disposed between the gate insulating films 102b and 102d. A continuous N+-type semiconductor layer 116c is formed on the surface region of the semiconductor substrate 100 which is opposite to the N+-type semiconductor layers 116a and 116b with respect to the gate insulating films 102a, 102b, 102c and 102d. An insulating film 117 (FIG. 5) which has a thickness of 1,000 to 2,000 Å is formed at the part disposed between the N+-type semiconductor layer 116c and part 146 of the first conductive layer 106 which is not on the field insulating film. This insulating film 117 is so formed to have a thickness greater than those of the gate insulating films 102a to 102d. Fourth conductive layers 120a and 120b of aluminum are formed on the third conductive layers 114a and 114b with an insulating film 118 interposed therebetween. The conductive layer 120a and the N+-type semiconductor layer 116a are connected by a contact hole 122a. The conductive layer 120b and the N+-type semiconductor layer 116b are connected by a contact hole 122b. The N+-type semiconductor layer 116c is connected to a point of reference potential, for example, a point of ground potential.

A region 124 surrounded by the broken lines in FIG. 2 shows a memory cell for 1 bit of the semiconductor memory device. As may be apparent from FIG. 3, this memory cell is a MOS transistor having the second conductive layer 108a as a floating gate, the third conductive layer 114a as a control gate, the first conductive layer 106 as an erase gate, the N+-type semiconductor layer 116a as a drain, and the N+-type semiconductor layer 116c as a source. Referring to FIG. 3, the control gate 114a is commonly used for memory cells of 2 bits, and the erase gate 106 is commonly used for the memory cells of 4 bits. A pair of memory cells having the common gate 114a are formed symmetrical about the erase gate 106. The control gate 114a is formed on the semiconductor substrate 100 with an insulating film interposed therebetween. The floating gates 108a and 108b and the erase gate 106 are juxtaposed within the insulating film sandwiched by the control gate 114a and the semiconductor substrate 100. Since the erase gate 106 is formed on the field insulating film 104b, parts where the respective floating gates 108a and 108b and the erase gate 106 overlap are formed within the field region. At these overlapping parts, as shown in FIG. 3, the second conductive layer (floating gate) 108a is above the first conductive layer (erase gate) 106. Therefore, the distance between the semiconductor substrate 100 and the first conductive layer 106 is less than that between the semiconductor layer 100 and the second conductive layer 108a.

Figure 1:
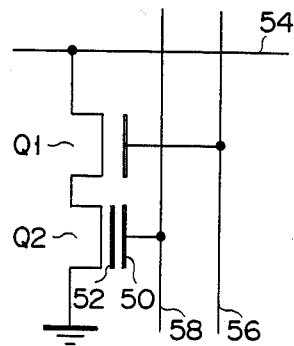
FIG. 1 is a circuit diagram of a memory cell of a conventional E²P-ROM.
Figure 6:
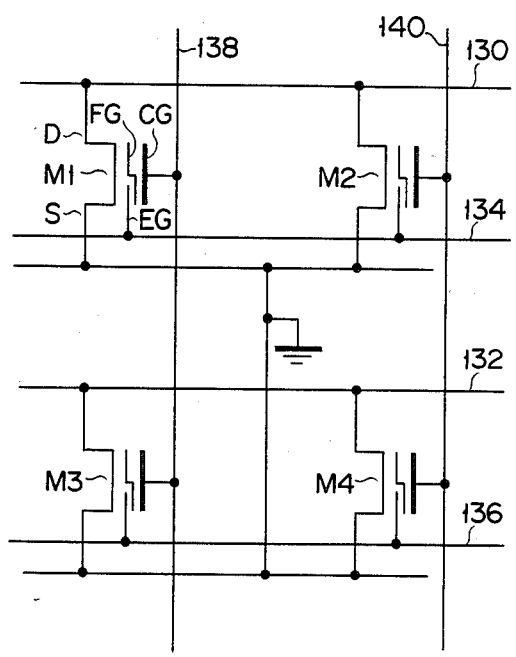
FIG. 6 is an equivalent circuit diagram of the semiconductor memory device shown in FIG. 2.

FIG. 6 is an equivalent circuit diagram of the semiconductor memory device shown in FIG. 2. Digit lines 130 and 132 correspond to the fourth conductive layers 120a and 120b, respectively, shown in FIG. 2, erase lines 134 and 136 correspond to the first conductive layer 106, and select lines 138 and 140 correspond to the third conductive layers 114a and 114b. Each of memory cells M1 to M4 comprises a control gate CG, floating gate FG, an erase gate EG, a drain D and a source S. The drains D of the memory cells M1 and M2 are connected to the digit line 130, the drains D of the memory cells M3 and M4 are connected to the other digit line 132, and the sources S of all the memory cells are connected to a point of gound potential.

The mode of operation of the semiconductor memory device of the present invention will be described with reference to the equivalent circuit diagram shown in FIG. 6. Description will be made with particular reference to the memory cell M1 shown in FIG. 6. Since the electrons are not injected to the floating gate FG of the memory cell M1 at the initial condition, the threshold voltage $V_{TH}$ of the memory cell M1 is at low level.

For writing data in this memory cell M1, a high voltage of positive polarity such as +20 V is applied to the select line 138, and a high voltage of positive polarity such as +20 V is applied to the digit line 130. Then, thermions flow from the source S to the drain D of the memory cell M1 and these thermions are injected to the floating gate FG from the channel region formed between the source and the drain. As a result of this, the threshold voltage $V_{TH}$ of the memory cell M1 is raised. For writing data, it is also possible to apply a high voltage pulse such as +20 V, or a dc voltage of +5 or 0 V to the erase line 134, or to open the erase line 134. It thus suffices to apply a predetermined voltage across the source and the drain and to apply a voltage of the same polarity to the first and third conductive layers.

For reading data from the memory cell M1, the select line 138 is selected and a high voltage such as +5 V is applied to the control gate CG of the memory cell M1. If the threshold voltage $V_{TH}$ is low when the high voltage is applied, the memory cell M1 is turned on. Then, a current flows from the digit line 130 through the memory cell M1 to the point of ground potential. If the threshold voltage $V_{TH}$ is high when the high voltage is applied, this memory cell M1 is off-state and the current does not flow. If logic level "1" is assigned to the condition wherein the current flows through the memory cell M1, and logic level "0" is assigned to the condition wherein the current does not flow through the memory cell M1, this memory cell may be used as a memory device. Since the floating gate FG is surrounded by the insulating films so as to be insulated from other elements, the electrons injected to the floating gate cannot be emitted outside the floating gate under the normal conditions. Therefore, this memory cell may be used as a nonvolatile memory device.

For erasing the data which has been written, the select line 138 and the digit line 130 are set at 0 V and a high voltage pulse such as +40 V is applied to the erase line 134. When this voltage is applied, field emission is caused between the floating gate FG and the erase gate EG of the memory cell M1 so that the electrons stored in the floating gate FG are emitted to the outside through the erase gate EG and the erase line 134. Consequently, the threshold voltage $V_{TH}$ of the memory cell M1 is restored to the low level as in the initial condition. For erasing data, it suffices to set the source region, the drain region, and the third conductive layer at substantially the same potential and to apply a voltage of the same polarity as that for writing data to the first conductive layer. If the voltage to be applied to the first conductive layer is greater than that to be applied to the first conductive layer for writing data, erasing of data may be performed with better efficiency.

In erasing data, a high voltage is applied to the erase line 134. However, since the insulating film 117 (FIGS. 2 and 5), thicker than the gate insulating films 102a, 102b, 102c and 102d, is formed between the N+-type semiconductor layer 116c and the part 146 of the first conductive layer which is on the regions other than the field insulating film 104b, the leakage current does not flow through this part.

The semiconductor memory device of the above construction has various advantages to be described below:

(b1) One transistor may constitute one memory cell which is capable of electrically erasing data. Therefore, the packaging density of the $E^2P$-ROMs may be made substantially the same for the EP-ROMs of the ultraviolet ray erasable type. Since less expensive plastic material may be used for the package, the manufacturing cost is less than that of the EP-ROMs of the ultraviolet erasable type.

(b2) Writing, erasing and reading out data may be performed with unipolar power sources. Power sources are only required to apply $+20V$ for writing, $+40V$ for erasing, and $+5V$ for reading, all of the positive polarity. Furthermore, it is possible to use only a single power source, that is, to dispense with all the other power sources by obtaining $+20V$ and $+40V$ from a voltage of $+5V$ through a booster. Since all the power sources may be mounted on the printed circuit board, the semiconductor memory device of the present invention is capable of writing, erasing and reading out data.

(b3) Unlike conventional $E^2P$-ROMs, the transistor for bit selection is unnecessary. Therefore data may be erased in units of words and all the bits with ease.

(b4) Since the field emission is utilized for erasing data, data may be erased in a short period of time.

(b5) Since data is written by the injection of thermions and data is erased by the field emission, the insulating films around the floating gate may be formed relatively thick. Therefore, the nonvolatile characteristics, that is, the data holding characteristics, may be improved.

(b6) The method for manufacturing the memory cell described above only requires the process for forming a three-layered polycrystalline silicon film by the conventional silicon gate process and requires no other processes.

(b7) Since the thickness of the field insulating film below the erase gate is greater than that of the insulating film interposed between the erase gate and the floating gate, application of a high voltage to the erase gate for erasing of data only results in discharge between the floating gate and erase gate and does not result in discharge between the semiconductor substrate and the erase gate.

In the embodiment described above, the floating gate is located above the erase gate at the part where the floating gate overlaps the erase gate. However, the floating gate may be formed below the erase gate at this part. In this case, since the capacitance between the control gate and the floating gate becomes small, an extra voltage must be applied for reading out and writing data.

Figure 7A:
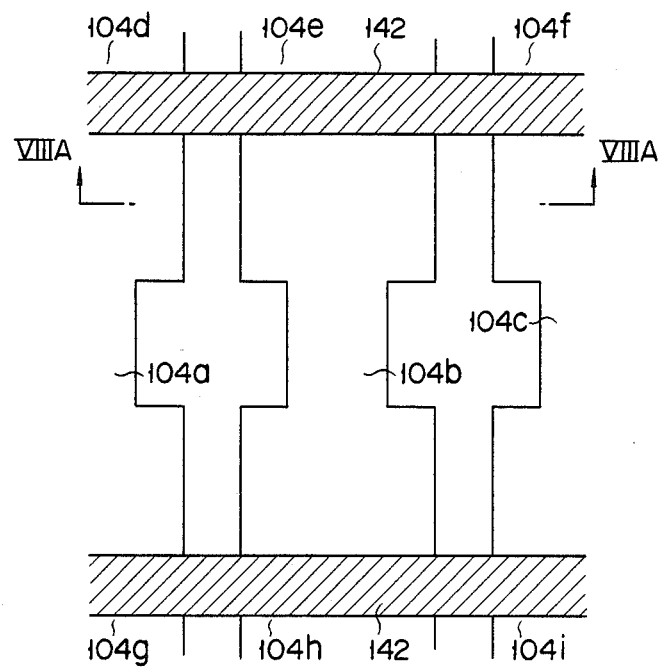
FIGS. 7A to 7E are plan views for explaining the method for manufacturing the semiconductor memory device of the first embodiment of the present invention.
Figure 7B:
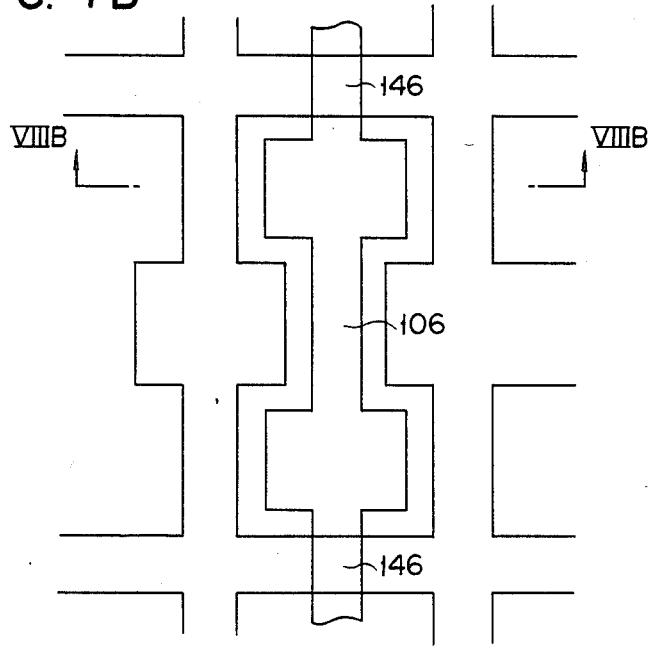

The method for manufacturing the semiconductor memory device shown in FIG. 2 will now be described with reference to FIGS. 7A to 7E and FIGS. 8A to 8E. FIGS. 7A to 7E are plan views of the semiconductor substrate and FIGS. 8A to 8E are sectional views along the lines VIIIA—VIIIA, VIIIB—VIIIB, . . . VIIIE—VIIIE, respectively, of FIGS. 7A to 7E. As shown in FIGS. 7A and 8A, an insulating film of $1\mu$ thickness is grown on the surface of the P-type silicon semiconductor substrate 100, and the field insulating films 104a, 104b, . . . 104i are formed by photolithography. In each of regions 142 indicated by hatched lines in FIG. 7A, is selectively diffused phosphorus or arsenic by the ion-implantation method or diffusion method. After this step of diffusing an impurity, the parts of the surface of the semiconductor substrate 100, other than those where the field insulating films 104a to 104i are formed, are exposed. On the exposed surfaces, a thermally oxidized film 144 of a relatively small thickness, i.e., 1,000 to 2,000 Å, is formed by the thermal oxidation method.

Figure 8A:
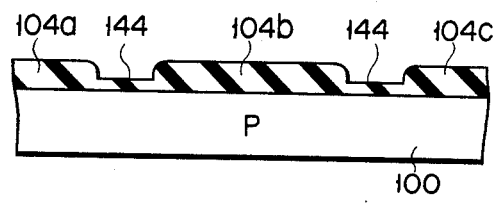
FIGS. 8A to 8E are sectional views along the lines VIIIA—VIIIA, VIIIB—VIIIB, . . . VIIIE—VIIIE, respectively, of FIGS. 7A to 7E.
Figure 8B:
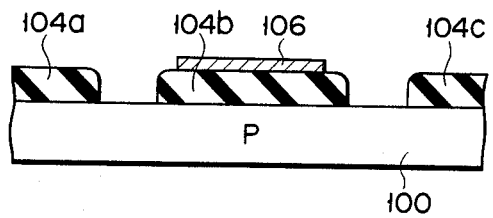

A polycrystalline silicon layer of 6,000 Å thickness is grown on the entire surface of the structure, and phosphorus or arsenic is doped in this polycrystalline silicon. This polycrystalline silicon layer is etched by photolithography to form the first conductive layer 106 as shown in FIGS. 7B and 8B. Using the first conductive layer as a mask, the thermally oxidized film 144 is removed and thereby forms the insulating film 117, having a thickness of 1,000 to 2,000 Å, below the part 146 of the first conductive layer 106. It is to be noted that the first conductive layer may be formed over the field insulating films 104a and 104c, adjacent to the field insulating film 104b.

Figure 7C:
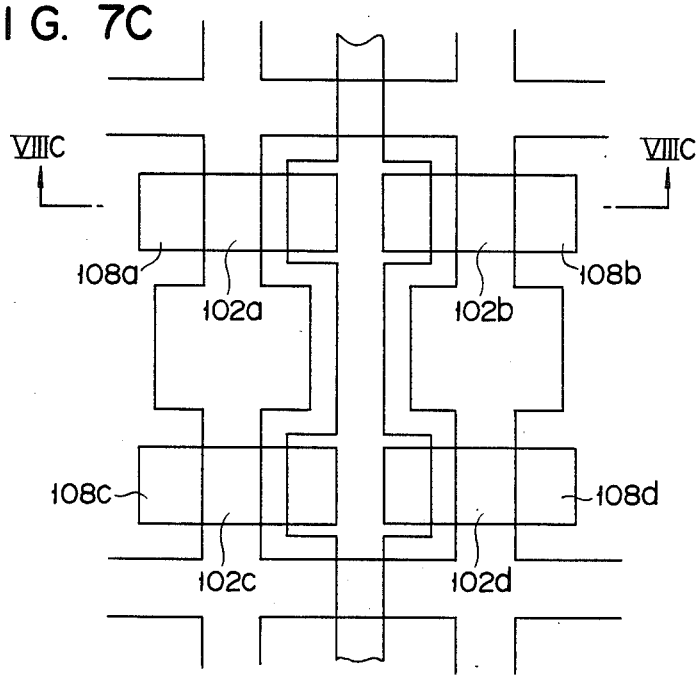
Figure 8C:
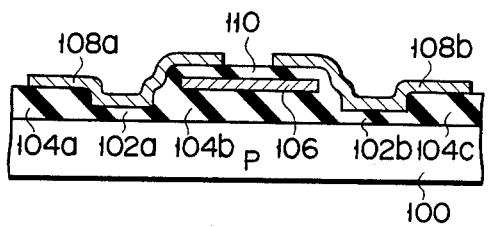

In the next step as shown in FIGS. 7C and 8C, the gate insulating films 102a, 102b, 102c and 102d and the insulating film 100 having a thickness of 500 Å, are formed by the thermal oxidation method on the exposed semiconductor substrate 100 and the first conductive layer 106. A polycrystalline silicon layer of 5,000 thickness is grown thereover by the CVD method. The second conductive layers 108a, 108b, 108c and 108d are formed on the gate insulating films 102a, 102b, 102c and 102d by photolithography.

Figure 7D:
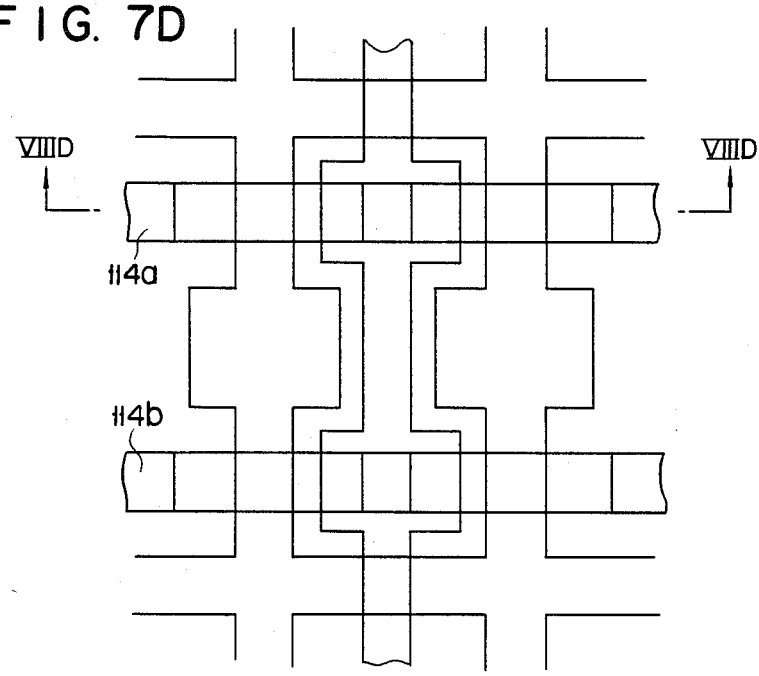
Figure 8D:
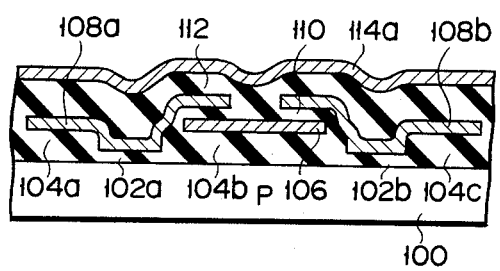

In the next step shown in FIGS. 7D and 8D, the insulating film 112, which has a thickness of 1,000 to 2,000 Å, is formed by the thermal oxidation method and a polycrystalline silicon layer is formed thereover. The polycrystalline silicon layer is etched by photolithography to form the third conductive layers 114a and 114b which are to function as the control gates. Then, using the third conductive layers as a mask, the second conductive layers 108a, 108b, 108c and 108d are etched to form the floating gates in a self-aligned manner.

Figure 7E:
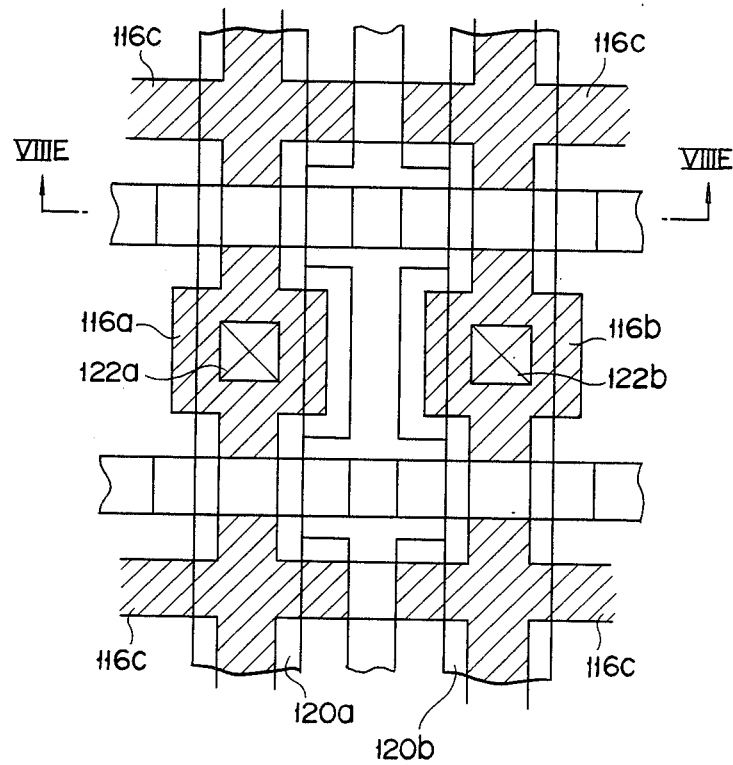
Figure 8E:
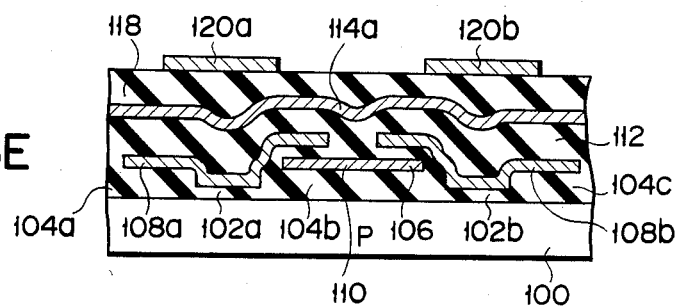

In the next step, using as a mask the second conductive layers 108a to 108d, the third conductive layers 114a and 114b, and the field insulating films 104a to 104i, phosphorus or arsenic is diffused in the regions indicated by the hatched lines in FIG. 7E to form the N+-type semiconductor layers 116a, 116b, and 116c. Thereafter, the insulating film 118 is deposited over the entire surface of the structure as shown in FIGS. 7E and 8E, to selectively form contact holes in the insulating film 118 which reach the N+-type semiconductor layers 116a and 116b. An aluminum film is then deposited over the insulating film 118 and the aluminum film is selectively etched by photolithography to form the fourth conductive layers 120a and 120b. The fourth conductive layers 120a and 120b are connected to the N+-type semiconductor layers 116a and 116b through the contact holes 122a and 122b, respectively.

The present invention is not limited to the embodiment described above. For example, it is also possible to form the first conductive layer on the field insulating film 104a and to make the other edges of the second conductive layers 108a and 108c overlap, with an insulating film interposed therebetween, with the first conductive layer on the field insulating film 104a. Alternatively, it is also possible to form the first conductive layer on the field insulating film 104c and to make the other edges of the second conductive layers 108b and 108d overlap, with an insulating film interposed therebetween, with the first conductive layer on the field insulating film 104c.

In the above embodiment, the first conductive layer 106 to function as the erase gate is common to the floating gates which are symmetrically arranged about this conductive layer. However, it is to be understood that the erase gate may be so formed as to erase the data of floating gate of only one memory cell.

The first conductive layer 106 and the second conductive layers 108a to 108d may be made of molybdenum.

Figure 9:
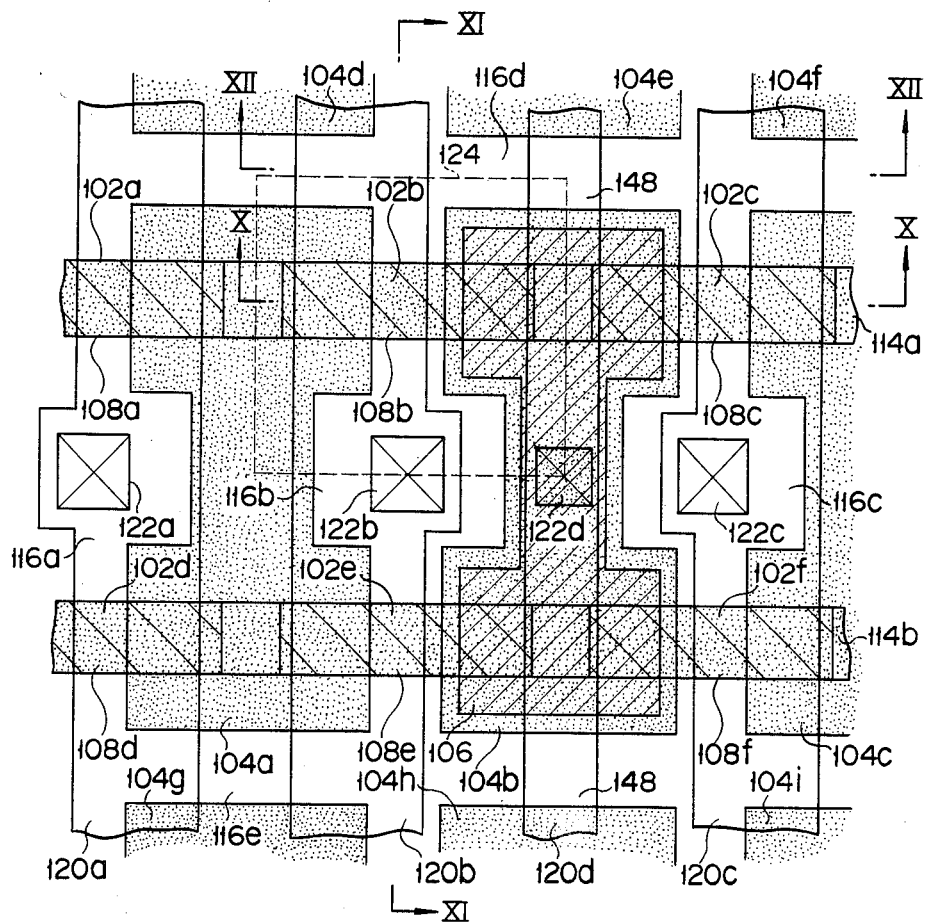
FIG. 9 is a plan view of the second embodiment of the semiconductor memory device of the present invention.
Figure 10:
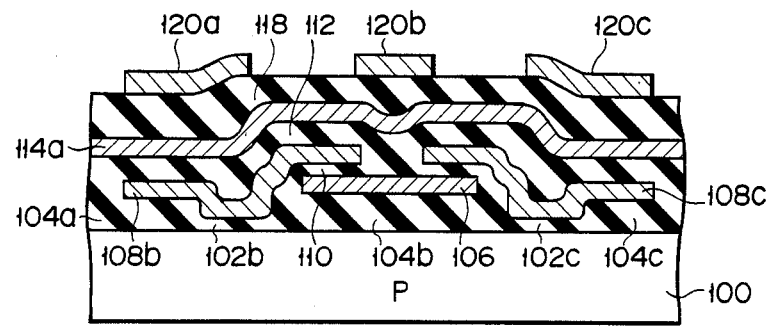
FIG. 10 is a sectional view along the line X—X of FIG. 9.
Figure 11:
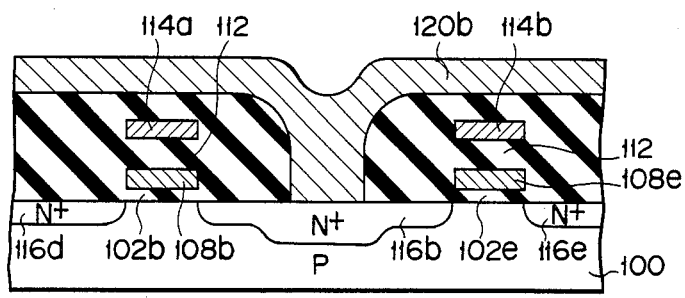
FIG. 11 is a sectional view along the line XI—XI of FIG. 9.
Figure 12:
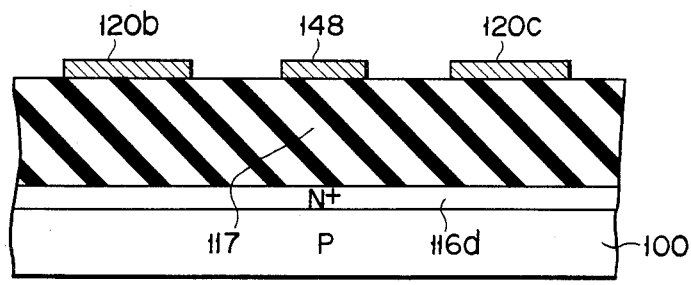
FIG. 12 is a sectional view along the line XII—XII of FIG. 9.

The second embodiment of the semiconductor memory device of the present invention will now be described referring to FIGS. 9 to 12. FIG. 9 is a plan view of a plurality of memory cells, FIG. 10 is a sectional view along the line X—X of FIG. 9, FIG. 11 is a sectional view along the line XI—XI of FIG. 9, and FIG. 12 is a sectional view along the line XII—XII of FIG. 9. Referring to FIG. 9, the doped regions of the semiconductor substrate 100 are indicated by the clear areas, the oxide areas are indicated by the dotted areas, and the polycrystalline silicon members are indicated by the cross-hatched areas.

The gate insulating films 102a to 102f of 500Å thickness are formed on the surface of the P-type silicon semiconductor substrate 100 with equal intervals therebetween in an X-Y matrix form. The field insulating films 104a, 104b, . . . , 104i are also formed on the surface of the semiconductor substrate 100. The field insulating film 104a is formed between the paired gate insulating films 102a and 102d and the paired gate insulating films 102b and 102e. The field insulating film 104b is formed between the paired gate insulating films 102b and 102e and the paired gate insulating films 102c and 102f. The field insulating film 104c is formed at the other edges of the paired gate insulating films 102c and 102f. The first conductive layer 106, having a thickness of 6,000 Å and consisting of polycrystalline silicon doped with phosphorus or arsenic, is formed in an island form. The second conductive layers 108a 108b, 108c, 108d, 108e and 108f, having a thickness of b 5,000 Å and consisting of polycrystalline silicon, are formed on the gate insulating films 102a, 102b, 102c, 102d, 102e and 102f, respectively, to be separate from each other. The respective right edges of the second conductive layers 108b and 108e overlap the left edge of the first conductive layer 106 with the insulating film 110 of 500 Å thickness interposed therebetween. The left edges of the second conductive layers 108c and 108f also overlap the right edge of the first conductive layer 106 with the insulating film 110 interposed therebetween. The third insulating film 112, which has a thickness of 1,000 to 2,000 Å and which consists of polycrystalline silicon, is formed on the second conductive layers 108a, 108b and 108c with the insulating film 112 interposed therebetween. The third conductive layer 114a has substantially the same width as those of the second conductive layers 108a, 108b and 108c. The third conductive layer 114b of polycrystalline silicon is formed on the second conductive layers 108d, 108e and 108f with the insulating film 112 interposed therebetween. The third insulating film 114b also has the same width as those of the second conductive layers 108d, 108e and 108f. The N+-type semiconductor layer 116a is formed on the surface region of the semiconductor substrate 100 which is disposed between the gate insulating film 102a and the gate insulating film 102d. The N+-type semiconductor layer 116b is formed on the surface region of the semiconductor substrate 100 which is disposed between the gate insulating film 102b and the gate insulating film 102e. The N+-type semiconductor layer 116c is formed on the surface region of the semiconductor substrate 100 which is disposed between the gate insulating film 102c and the gate insulating film 102f. The continuous N+-type semiconductor layer 116d is formed on the surface region of the semiconductor substrate 100 which is opposite to the N+-type semiconductor layers 116a, 116b and 116c with respect to the gate insulating films 102a, 102b and 102c. A continuous semiconductor layer 116e is formed on the surface region of the semiconductor substrate 100 which is opposite to the N+-type semiconductor layers 116a, 116b and 116c with respect to the gate insulating films 102d, 102e and 102f. The fourth conductive layers 120a, 120b, 120c and 120d, all of aluminum, are formed with the insulating film 118 interposed therebetween, on the third conductive layers 114a and 114b and the first conductive layer 106. The fourth conductive layer 120a and the N+-type semiconductor layer 116a are connected through the contact hole 122a. The fourth conductive layer 120b and the N+-type semiconductor layer 116b are connected through the contact hole 122b. The fourth conductive layer 120c and the N+-type semiconductive layer 116c are connected through a contact hole 122c. The fourth conductive layer 120d is connected to the first conductive layer 106 through a contact hole 122d. The insulating film 117 of a thickness greater than that for the first embodiment is disposed between a part 148 of the fourth layer 120d which is not on the field insulating film 104b and the N+-type semiconductor layers 116d and 116e (FIG. 12). The thickness of the insulating film 117 is greater than those of the gate insulating films 102a to 102f. The N+-type semiconductor layers 116d and 116e are connected to a point of reference potential, for example, a point of ground potential.

The region 124 indicated by the broken line in FIG. 9 indicates a memory cell for 1 bit of the semiconductor memory device. This memory cell is a MOS transistor which has, as apparent from FIG. 9, the second conductive layer 108b as a floating gate, the third conductive layer 114a as a control gate, the first conductive layer 106 as an erase gate, the N+-type semiconductor layer 116b as a drain, and the N+-type semiconductor layer 116d as a source. As may be seen from FIG. 10, the control gate 114a is common to memory cells for 2 bits, and the island-shaped erase gate 106 is formed commonly for the memory cells for 4 bits. A pair of memory cells having the common control gate 114a are formed symmetrically about the erase gate 106. The control gate 114a is formed on the semiconductor substrate 100 with the insulating film interposed therebetween. The floating gates 108b and 108c, and the erase gate 106 are juxtaposed in the insulating film interposed between the erase gate 114a and the semiconductor substrate 100. Since the erase gate 106 is formed on the field insulating film 104b, parts of the floating gates 108b and 108c overlapping with the erase gate 106 are present in the field region. As also seen from FIG. 10, at this overlapping part, the floating gate (the second conductive layer) 108a is located above the erase gate (the first conductive layer) 106. Therefore, the distance between the semiconductor substrate 100 and the first conductive layer 106 is smaller than the distance between the semiconductor substrate 100 and the second conductive layer 108a.

The equivalent circuit of the semiconductor memory device shown in FIGS. 9 to 11 is of the same configuration as that shown in FIG. 6. The operation of this equivalent circuit is also the same as that in the first embodiment, so that the description thereof will be omitted.

The second embodiment of the present invention has, in addition to the seven advantages of the first embodiment, two more advantages described below:

(b8) Since the erase line comprises the fourth conductive layer 120d of aluminum, the thick insulating film 117 may be formed between the N+-type semiconductor layers 116d and 116e and the part 148 of the fourth conductive layer formed on the region other than on the field insulating film 104b. Consequently, the current leakage is not caused even if a high voltage is applied to the erase line.

(b9) The fourth conductive layer 120d and the erase gate for 4 bits may be connected through a single contact hole if the erase gate is formed to be common for memory cells for 4 bits as in the second embodiment. Therefore, the number of the contact holes may be reduced and the packaging density may be improved.

Figure 13A:
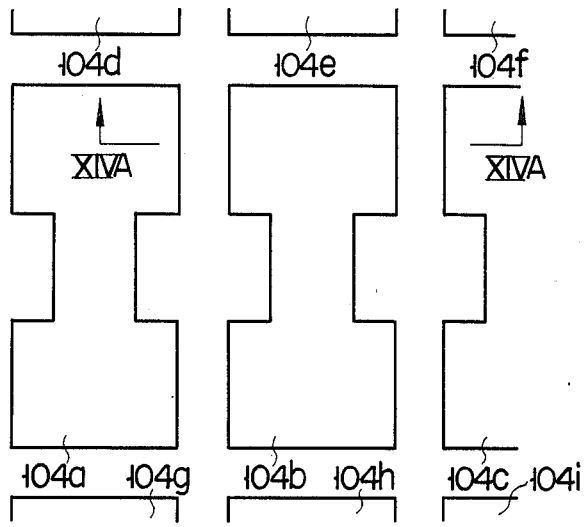
Figure 13B:
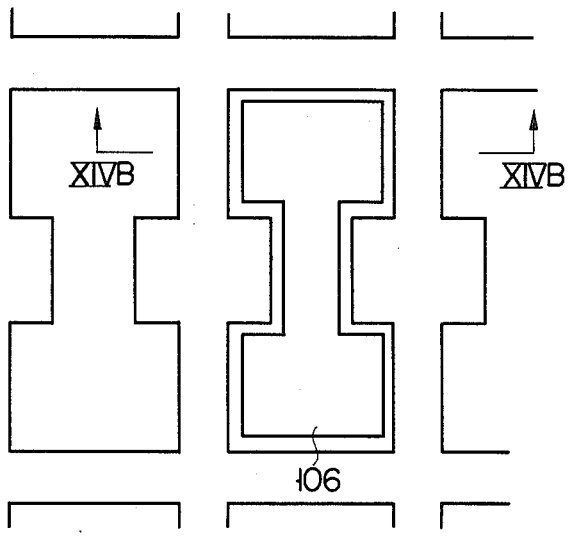

The method for manufacturing the semiconductor memory device of the second embodiment will be described with reference to FIGS. 13A to 13E and FIGS. 14A to 14E. FIGS. 13A to 13E are plan views of the semiconductor substrate, and FIGS. 14A to 14E are sectional views along the lines XIVA—XIVA, XIVB—XIVB, . . . , XIVE—XIVE, respectively, of FIGS. 13A to 13E. As shown in FIGS. 13A and 14A, an insulating film of 1μ thickness is grown on the surface of the P-type silicon semiconductor substrate 100. The field insulating films 104a, 104b, 104c, 104d, 104e, 104f, 104g, 104h and 104i are formed by photolithography. A polycrystalline silicon layer of 6,000 Å thickness is grown over the entire surface of the structure. Phosphorus or arsenic is doped in this polycrystalline silicon layer. The polycrystalline silicon layer is etched by photolithography to form the first conductive layer 106 on the field insulating film 104b as shown in FIGS. 13B and 14B. The first conductive layer may also be formed as needed on the field insulating films 104a, 104b, 104c, 104d, 104e, 104f, 104g, 104h and 104i which are adjacent to the field insulating film 104b.

Figure 13C:
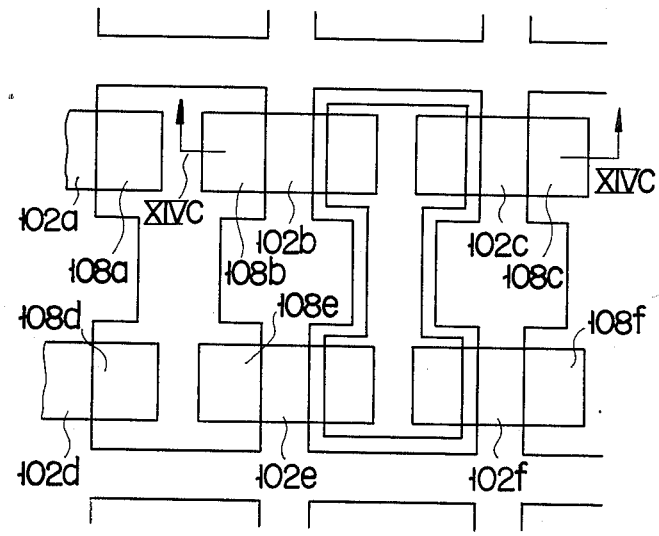

In the next step, as shown in FIGS. 13c and 14c, the insulating film 110 and the gate insulating films 102a, 102b, 102c, 102d, 102e and 102f which have a thickness of 500 Å are formed by the thermal oxidation method on the first conductive layer 106 and the exposed semiconductor substrate 100, respectively. A polycrystalline silicon layer of 5,000 Å is grown by the CVD method thereover, and the second conductive layers 108a to 108f as the floating gates are formed on the gate insulating films 102a to 102f and the insulating film 110.

Figure 13D:
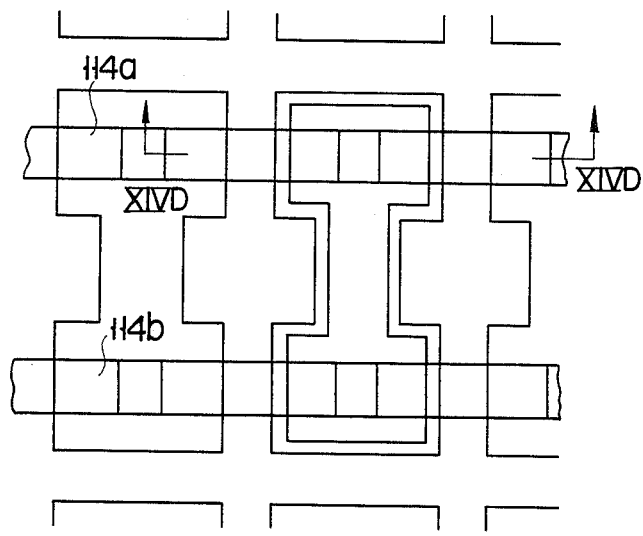

In the next step as shown in FIGS. 13D and 14D, the insulating film 112 which has a thickness of 1,000 to 2,000 Å is formed by the thermal oxidation method, and a polycrystalline silicon layer is formed thereover. The polycrystalline silicon layer is etched by photolithography to form the third conductive layers 114a and 114b to function as the control gates. Using the third conductive layers as a mask, the second conductive layers 108a to 108f are etched to form the floating gates in a self-aligned manner.

Using as a mask the second conductive layers 108a to 108f, the third conductive layers 114a and 114b, and the field insulating films 104a to 104i phosphorus or arsenic is doped in the region indicated by the hatched lines in FIG. 13E to form the N+-type semiconductor layers 116a, 116b and 116c as the drains and N+-type semiconductor layers 116d and 116e as the sources. Thereafter, as shown in FIGS. 13E and 14E, the insulating film 118 is deposited on the entire surface of the structure and holes are selectively formed which extend to the N+-type semiconductor layers 116a, 116b and 116c and the first conductive layer 106. After an aluminum film is deposited over the insulating film 118, this aluminum film is selectively etched by photolithography to form the fourth conductive layers 120a, 120b 120c and 120d. The fourth conductive layers 120a, 120b and 120c are connected to the N+-type semiconductor layers 116a, 116b and 116c through the contact holes 122a, 122b and 122c, respectively. The fourth conductive layer 120d is connected to the first conductive layer 106 through the contact hole 122d.

In the second embodiment, one erase gate is commonly formed for memory cells for 4 bits. However, it is also possible to form one erase gate for a memory cell for 1 bit or to form one erase gate for memory cells for 2 bits.

The third embodiment of the semiconductor memory device of the present invention will now be described with reference to FIGS. 15 to 19. In the equivalent circuit shown in FIG. 6 which has been described hereinbefore, when electrons are excessively discharged from the floating gate FG of the memory cell for erasing data, the memory cell does not become the enhancement type but the depletion type. This will be described in more detail with reference to FIG. 15. In FIG. 15, the voltage VG applied to the control gate CG is plotted along the abscissa, and the square root of the drain current ID is plotted along the ordinate. Characteristic curve o shows the enhancement type characteristics of a MOS transistor under the condition that no data is written therein. Characteristic curve β shows the characteristics of the MOS transistor under the condition that data is written therein and the threshold voltage is raised. When the data is erased in a normal manner from the floating gate FG of the memory cell which has the characteristics shown by the characteristic curve β, this memory cell is restored to the condition to have the characteristics shown by the characteristic curve α. However, when electrons are excessively discharged from the floating gate FG for erasing data, the memory cell will have the characteristics of depletion type which are shown by a characteristic curve a.

For reading out data from one memory cell, for example, the memory cell M1 shown in FIG. 6, the digit line 130 and the select line 138 are selected and a high voltage is applied to both these lines. Data is read out depending upon whether or not a current flows to the memory cell M1. In this condition, the select line 140 is not selected and is set at low level. However, if electrons are excessively discharged from the floating gate FG of the memory cell M2 and the memory cell M2 becomes depletion type, this memory cell M2 is turned on and a current flows therethrough although it is not selected. Therefore, it is impossible to read out data from the selected memory cell M1.

Figure 17:
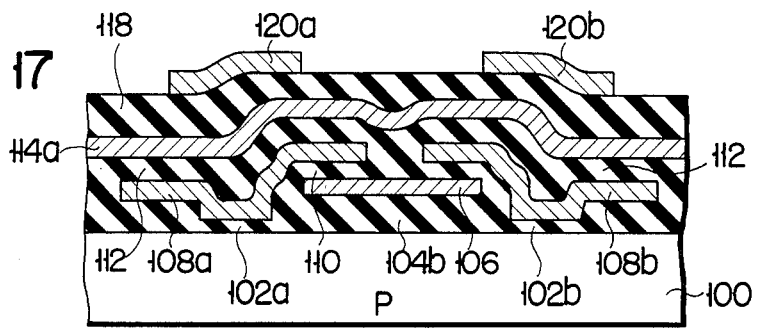
FIG. 17 is a sectional view along the line XVII—XVII of FIG. 16.
Figure 18:
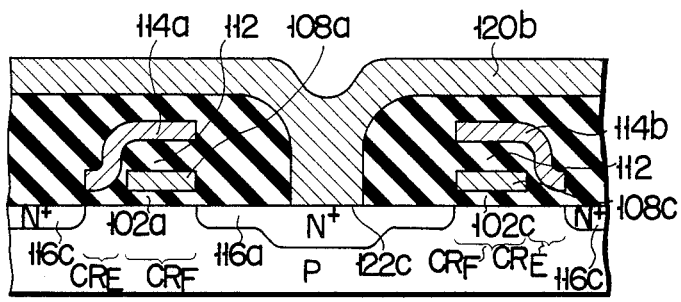
FIG. 18 is a sectional view along the line XVIII—XVIII of FIG. 16.
Figure 19:
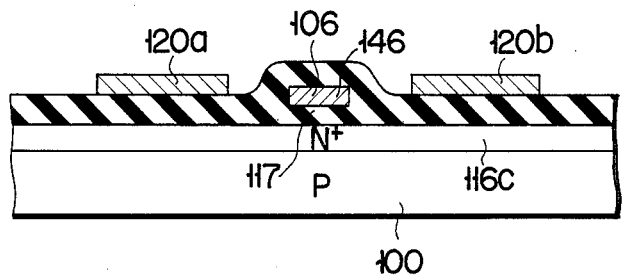
FIG. 19 is a sectional view along the line XIX—XIX of FIG. 16.

The semiconductor memory device shown in FIGS. 16 to 19 is an improved semiconductor memory device which provides a solution to this problem. FIG. 16 is a plan view of memory cells for 4 bits, FIG. 17 is a sectional view along the line XVII—XVII of FIG. 16, FIG. 18 is a sectional view along the line XVIII—XVIII of FIG. 16, and FIG. 19 is a sectional view along the line XIX—XIX of FIG. 16. Referring to FIG. 16, the doped regions of the semiconductor substrate are indicated by clear areas, the oxide areas are indicated by dotted areas, and the polycrystalline silicon members are indicated by cross-hatched areas. Since the semiconductor memory device according to the third embodiment has the similar structure as that of the first embodiment, the same reference numerals denote the same parts as in FIGS. 2 to 5.

The semiconductor memory device shown in FIGS. 16 to 19 differs from that of the first embodiment in that the width W2 of the second conductive layers 108a, 108b, 108c and 108d functioning as the floating gates is narrower than the width W3 of the third conductive layers 114a and 114b functioning as the control gates. The difference also resides in that the width W2 of the second conductive layers 108a to 108d along the direction of channel is smaller than the channel length, and the width W3 of the third conductive layers 114a and 114b along the direction of channel is equal to or greater than the channel length. As may be seen from FIG. 18, the substrate region in which the channels is formed consists of a substrate region CRF on which are formed the second conductive layers 108a and 108c with the gate insulating films 102a and 102c interposed therebetween and a substrate region $CR_E$ on which are formed the third conductive layers 114a and 114b with the gate insulating films 102a and 102c interposed therebetween.

Figure 20:
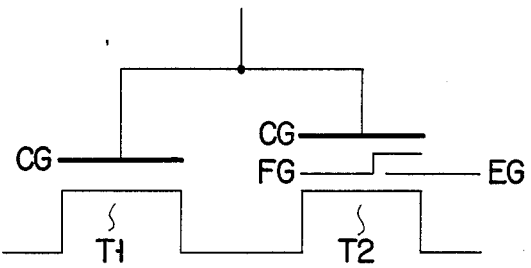
FIG. 20 is an equivalent circuit diagram of a memory cell for 1 bit of the third embodiment of the present invention.

In the semiconductor memory device of the construction described above, the memory cell for 1 bit indicated by the broken line in FIG. 16 may be represented by the equivalent circuit diagram shown in FIG. 20. This memory cell thus consists of an enhancement type MOS transistor T1 in which a channel is formed in the substrate region $CR_E$, and a double gate type MOS transistor T2 in which a channel is formed in the substrate region $CR_F$ and which has an erase gate. These transistors T1 and T2 are series-connected.

In the memory cell of this construction, even when the electrons are excessively discharged from the floating gate FG of the enhancement type MOS transistor T2 to convert the MOS transistor T2 to the depletion type MOS transistor, the enhancement type MOS transistor T1 is kept off as long as the third conductive layers 114a and 114b are at 0V or at ground potential. Since a current does not flow to a memory cell which is not selected, data may be read out from the memory cell independently of the condition of the MOS transistor T2.

Figure 21A:
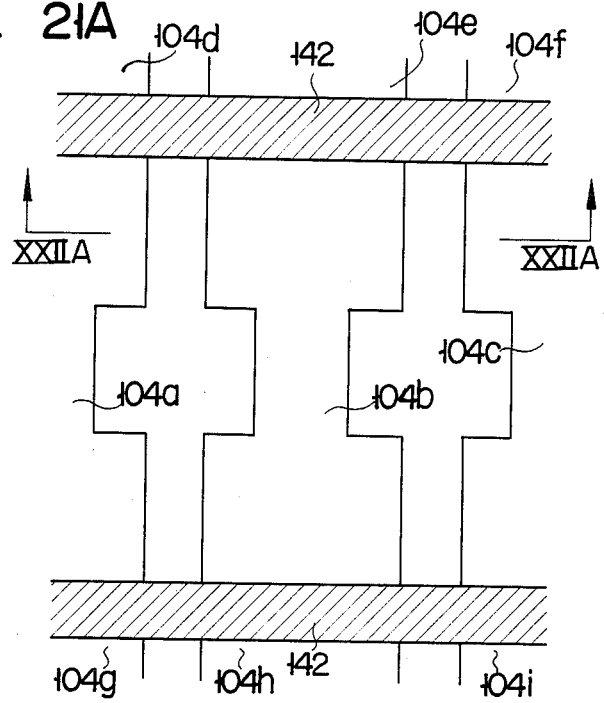
FIGS. 21A to 21E are plan views of the semiconductor substrate for explaining the method for manufacturing the semiconductor memory device according to the third embodiment of the present invention.
Figure 21B:
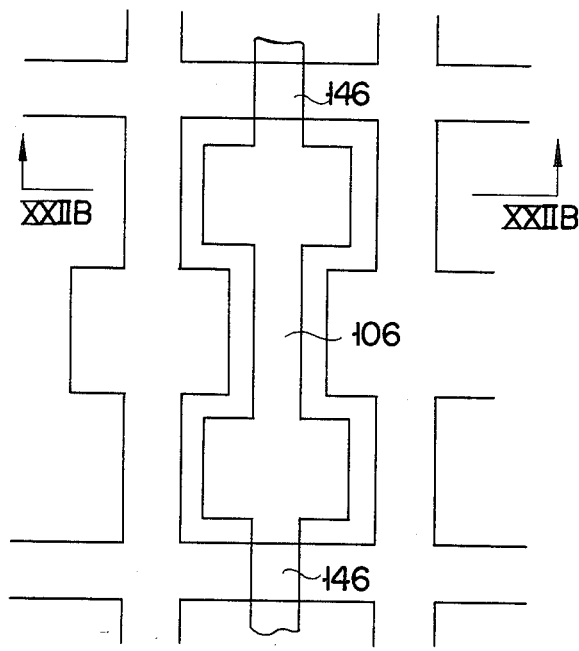
Figure 21C:
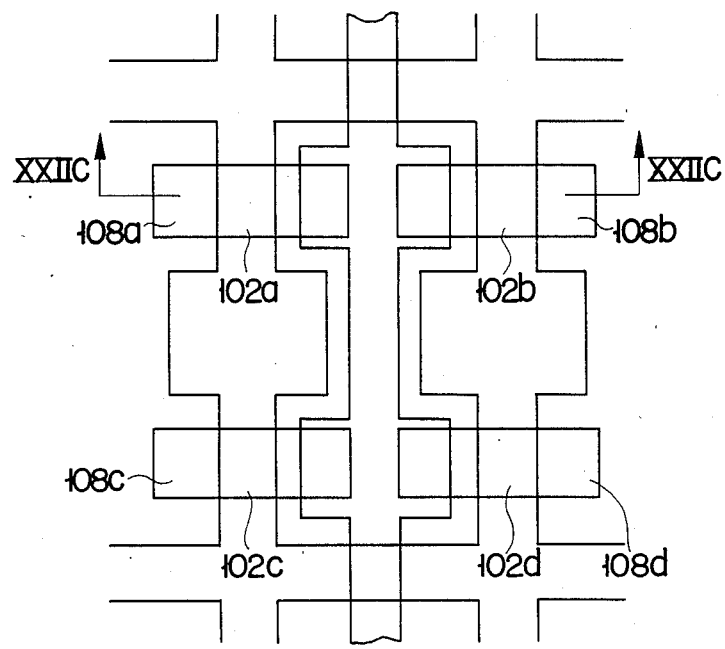
Figure 21D:
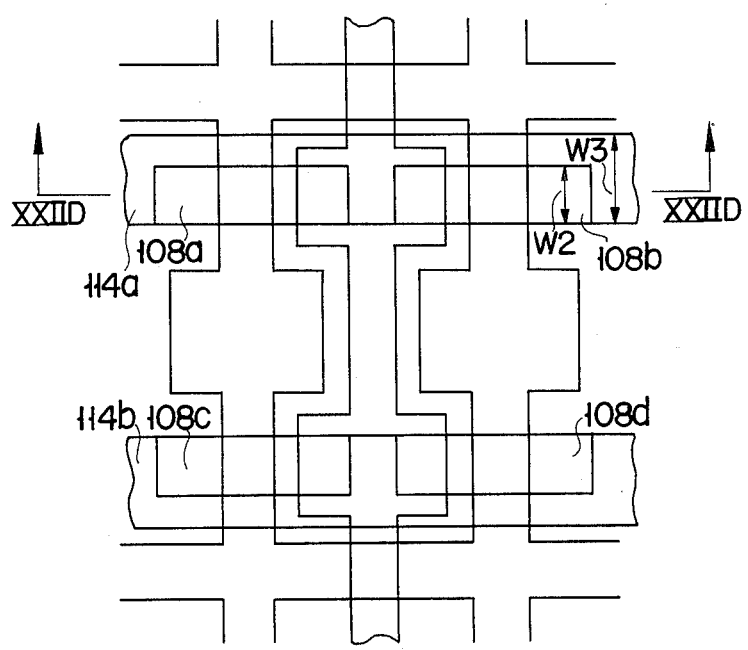

The method for manufacturing the semiconductor memory device according to the third embodiment of the present invention will now be described with reference to FIGS. 21A to 21E and FIGS. 22A to 22E. FIGS. 21A to 21E are plan views of the semiconductor substrate, and FIGS. 22A to 22E are sectional views along the lines XXIIA—XXIIA, XXIIB—XXIIB, ..., XXIIE—XXIIE, respectively, of FIGS. 21A to 21E. The method for manufacturing the semiconductor memory device of the third embodiment is similar to that for the first embodiment. Therefore, the same reference numerals denote the same parts as in FIGS. 7A to 7E and FIGS. 8A to 8E, and only different steps will be described. First, after forming the second conductive layers 108a, 108b, 108c and 108d as shown in FIGS. 21C and 22C, the insulating film 112 which has a thickness of 1,000 to 2,000 Å is formed by the thermal oxidation method as shown in FIG. 22D. A polycrystalline silicon layer is deposited over this insulating film 112. The polycrystalline silicon layer is etched by photolithography to form the third conductive layers 114a and 114b having the width W3. In this step, one side each of the second conductive layers 108a, 108b, 108c and 108d is self-aligned with one side each of the third conductive layers 114a and 114b, so that the second conductive layers 108a, 108b, 108c and 108d have the width W2.

Figure 21E:
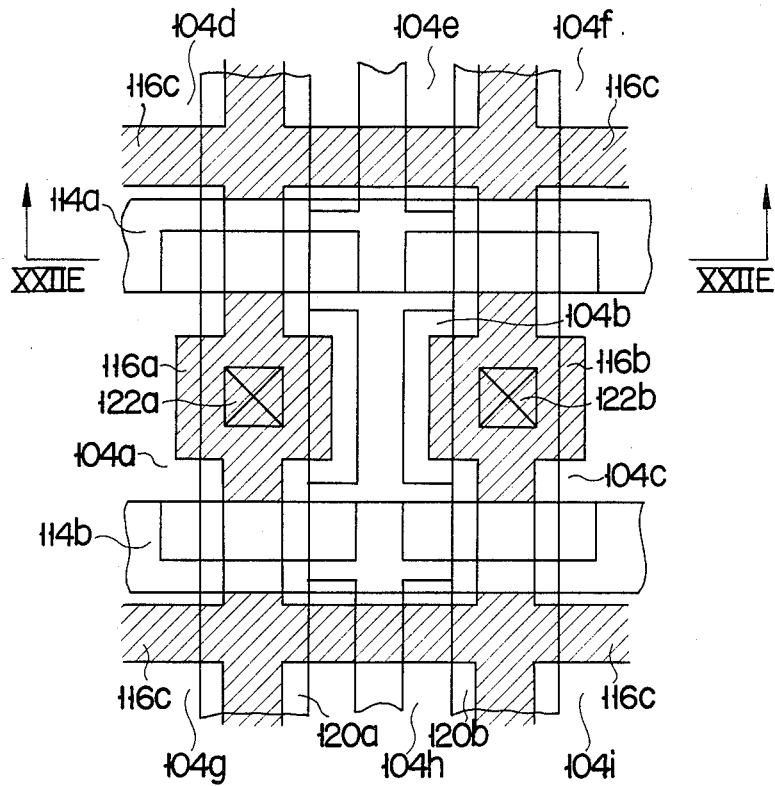

In the next step as shown in FIG. 21E, using as a mask the third conductive layers 114a and 114b and the field insulating films 104a to 104i, phosphorus or arsenic is diffused in the region indicated by the hatched lines to form the N+-type semiconductor layers 116a and 116b functioning as the drains and the N+-type semiconductor layer 116c functioning as the source. The following steps are the same as those in the method for manufacturing the semiconductor memory device according to the first embodiment.

The fourth embodiment of the semiconductor memory device of the present invention will now be described with reference to FIGS. 23 to 26. FIG. 23 is a plan view of the semiconductor substrate, FIG. 24 is a sectional view along the line XXIV—XXIV of FIG. 23, FIG. 25 is a sectional view along the line XXV—XXV of FIG. 23, and FIG. 26 is a sectional view along the line XXVI—XXVI of FIG. 23. Referring to FIG. 23, the doped regions of the semiconductor substrate are indicated by clear areas, the oxide areas are indicated by the dotted areas, and the polycrystalline silicon members are indicated by the cross-hatched areas. Since the semiconductor memory device according to the fourth embodiment has the similar structure as that of the second embodiment, the same reference numerals denote the same parts as in FIGS. 9 to 12.

The semiconductor memory device of the fourth embodiment differs from the semiconductor memory device of the second embodiment shown in FIG. 9 in that the width W2 of the second conductive layers 108a, 108b, 108c, 108d, 108e and 108f functioning as the floating gates is narrower than the width W3 of the third conductive layers 114a and 114b functioning as the control gates. The difference also resides in that the width W2 of the second conductive layers 108a to 108f along the direction of channel is shorter than the channel length, and the width W3 of the third conductive layers 114a and 114b along the direction of channel is equal to or greater than the channel length. As may be seen from FIG. 25, the substrate region at which the channel is formed consists of the substrate region $CR_F$ on which the second conductive layer 108b is formed with the gate insulating film 102b interposed therebetween and the substrate region $CR_E$ on which the third conductive layer 114a is formed with the gate insulating film 102b interposed therebetween.

In the semiconductor memory device of the construction shown in FIG. 23, the memory cell for 1 bit present in the region 124 surrounded by the broken lines may be represented by the equivalent circuit diagram as shown in FIG. 20, the description of which has been already made. Thus, this memory cell consists of the enhancement type MOS transistor T1 in which the channel is formed in the substrate region $CR_E$ shown in FIG. 25 and the double gate type MOS transistor T2 in which the channel is formed in the substrate region $CR_F$ and which has the erase gate. These transistors T1 and T2 are series-connected.

In the memory cell of this construction, as in the case of the third embodiment, even if the electrons are excessively discharged from the floating gate FG of the enhancement type MOS transistor T2 and the MOS transistor T2 is converted to the depletion type MOS transistor, the enhancement type MOS transistor T1 is kept off as long as the third conductive layers 114a and 114b are at 0V or at ground potential. Therefore, data may be read out from the memory cell independently of the condition of the MOS transistor T2 since a current does not flow to the memory cell which is not selected.

Figure 27A:
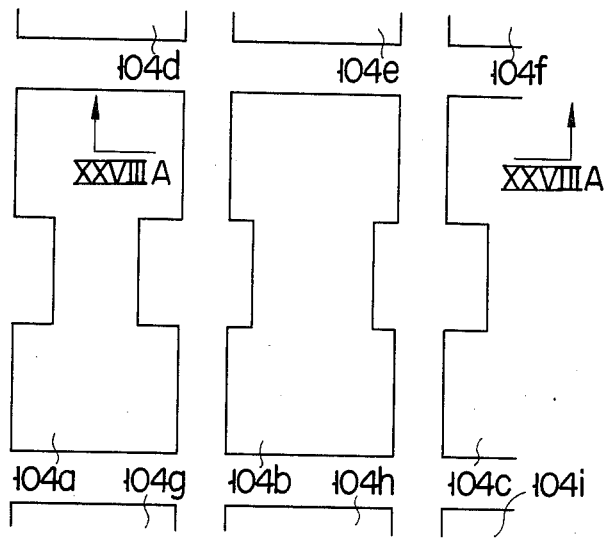
Figure 27B:
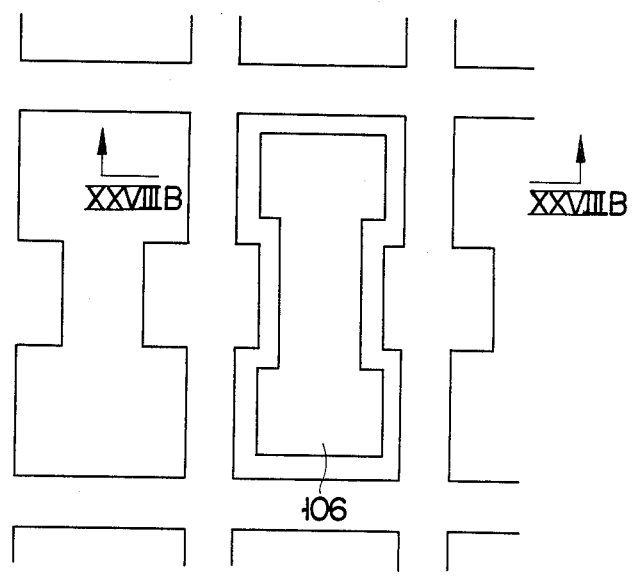

The method for manufacturing the semiconductor memory device according to the fourth embodiment of the present invention will now be described with reference to FIGS. 27A to 27E and FIGS. 28A to 28E. FIGS. 27A to 27E are plan views of the semiconductor substrate, and FIGS. 28A to 28E are sectional views along the lines XXVIIIA—XXVIIIA, XXVIIIB—XXVIIIB, ..., XXVIIIE—XXVIIIE, respectively, of FIGS. 27A to 27E. The method for manufacturing the semiconductor memory device of the fourth embodiment is similar to that for the second embodiment. Therefore, the same reference numerals denote the same parts as in FIGS. 13A to 13E and FIGS. 14A to 14E, and only different steps will be described. After forming the second conductive layers 108a, 108b, 108c, 108d, 108e and 108f as shown in FIGS. 27C and 28C, the insulating film 112, having a thickness of 1,000 to 2,000 Å, is formed by the thermal oxidation method as shown in FIG. 28D. A polycrystalline silicon layer is deposited on the insulating film 112, and this polycrystalline silicon layer is etched by photolithography to form the third conductive layers 114a and 114b having the width W3. Simultaneously with this, one side each of the second conductive layers 108a, 108b, 108c, 108d, 108e and 108f is self-aligned with one side each of the third conductive layers 114a and 114b, so that the second conductive layers 108a to 108f may have the width W2.

Figure 27E:
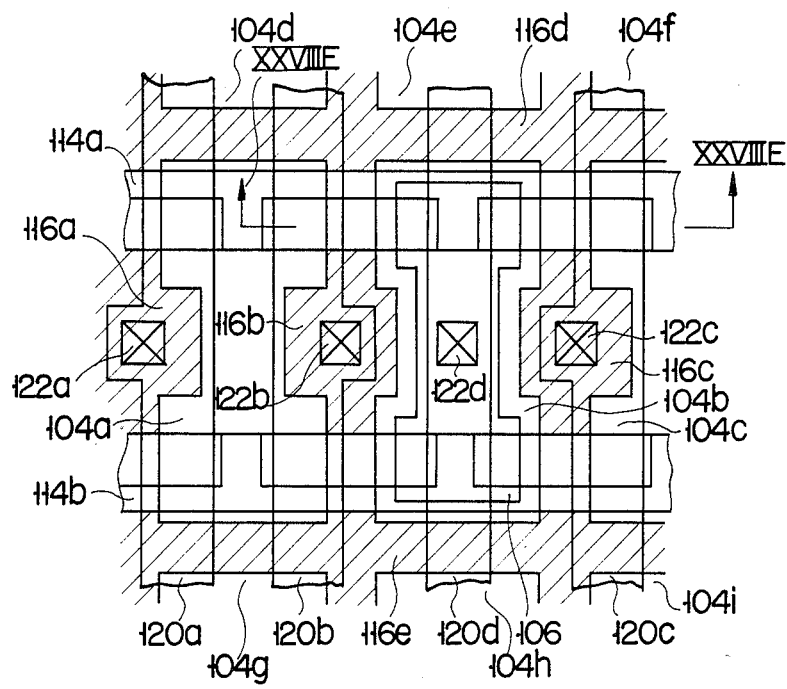

In the next step as shown in FIG. 27E, using as a mask the third conductive layers 114a and 114b and the field insulating films 104a to 104i, phosphorus or arsenic is doped in the region indicated by hatched lines to form the N+-type semiconductor layers 116a, 116b and 116c functioning as the drains and the N+-type semiconductor layers 116d and 116e functioning as the sources. The following steps are the same as those described with reference to the second embodiment.

Figure 29:
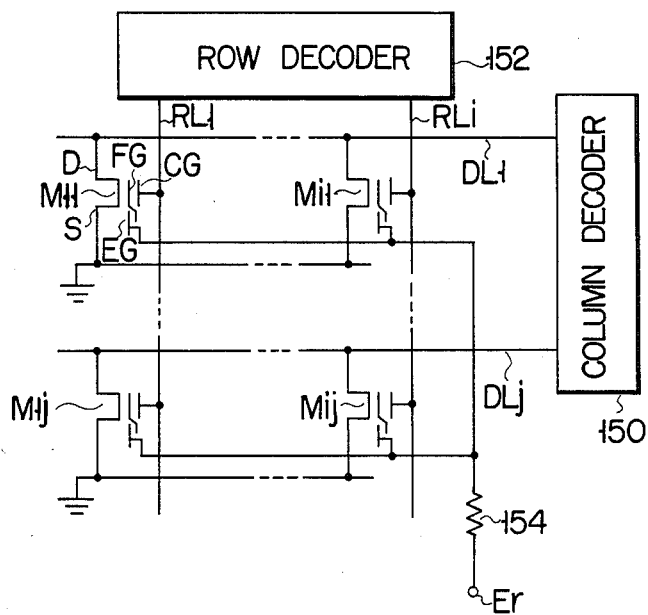
FIG. 29 is a circuit diagram of a semiconductor memory device of i×j bits using the memory cells according to the first to fourth embodiments of the present invention.

FIG. 29 shows a semiconductor memory device of i×j bits using the memory cells according to the first to fourth embodiments described hereinbefore. The memory cells are arranged in the matrix form; they number i in the column direction and j in the row direction. Each of the memory cells M11 to Mij comprises the control gate CG, the floating gate FG, the erase gate EG, the drain D and the source S. The drains D of the respective memory cells numbering i in the same column are commonly connected to respective digit lines DL1 to DLj numbering j. The digit lines DL1 to DLj numbering j altogether are connected to the output ends of a column decoder 150. A column address is input to this column decoder 150 and, one output end thereof is selected according to this column address when reading out or writing data. A high voltage such as +5V or +20V is output from the selected output end, and low voltages of 0V, for example, are output from the nonselected output ends. The control gates CG of the respective memory cells numbering j in the same rows are commonly connected to respective row lines RL1 to RLi numbering i. These row lines RL1 to RLi numbering i are also connected to the output ends of a row decoder 152. A row address is input to this row decoder 152, and one output end thereof is selected according to this row address when reading out or writing data. A high voltage is then output from the selected output end alone, and low voltages are output from all of the nonselected output ends. The erase gates EG of all the memory cells are commonly connected and also to an erase terminal Er through a protective resistor 154. The sources of all the memory cells are commonly connected as well as to the point of ground potential.

A data erasing voltage of, for example, +40 V is applied to the erasing terminal Er when erasing data stored in the respective memory cells.

In the semiconductor memory cell of this construction, the threshold voltage of the transistor constituting the memory cell may change at a rate of $$\Delta V_{TH} = Q_F/C_{FC} \quad (1)$$

where $C_{FC}$ is the capacitance between the floating gate FG and the control gate CG and assuming that a charge (electrons) $-Q_F$ is injected in the floating gate FG. Since the threshold voltage changes $\Delta V_{TH}$ as given by relation (1) above due to the charge $-Q_F$, data stored in the memory cell may be discriminated as "1" or "0".

The rate of change $\Delta V_{TH}$ of the threshold voltage when a voltage $V_E$ is applied to the erase gate EG through the erase terminal Er may be given by:

$$\Delta V_{TH} = (Q_F - C_{FE} \cdot V_E)/C_{FC} \quad (2)$$

where $C_{FE}$ is the capacitance between the floating gate FG and the erase gate EG.

From relation (2), the charge $-(Q_F - C_{FE} \cdot V_E)$ apparently stored in the floating gate may be increased or decreased by the voltage $V_E$ to be applied to the erase gate EG. Therefore, the charge injected to the floating gate FG may be quantitatively determined from the voltage applied to the erase gate EG. In this manner, $Q_F$ may be determined from relation (2) by measuring the voltage $V_E$ applied to the erase gate which is necessary for obtaining a certain rate of charge $\Delta V_{TH}$ of the threshold voltage.

A practical method for measuring the charge $Q_F$ may be as follows. A memory cell is selected by decoders 150 and 152. Then, the value of the voltage $V_E$ with which the data of the digit line of the selected memory cell is inverted is measured while changing the voltage $V_E$ applied to the erase terminal Er. If the charge $Q_F$ of the memory cell immediately after writing of data is measured and the charge $Q_F$ of this memory cell is measured after a predetermined period of time has elapsed, the rate of attenuation of the charge over time may be determined from both of the measurements. Since the charge retention characteristics of the respective memory cells may thus be evaluated, bits of inferior charge retention characteristics of the memory cells may be screened out in advance.

For determining the charge $Q_F$ on the memory cell with efficiency, it is assumed that $C_{FE} \simeq C_{FC}$ in relation (2). However, it must be assumed that $C_{FC} > C_{FE}$ from the viewpoint of better writing efficiency. Therefore, it is preferable to satisfy the relation:

$$C_{FC} > C_{FE} \geq C_{FC}/5 \quad (3)$$

where $C_{FE}$ is the capacitance between the floating gate and the erase gate and $C_{FC}$ is a constant capacitance between the floating gate and the control gate in order to check the charge with efficiency while maintaining a good writing efficiency.

FIG. 30 shows an another semiconductor memory device of i×j bits consisting of memory cells having the erase gates according to the present invention. This semiconductor memory device is capable of writing and erasing data in units of bits. The memory cells are arranged in an X-Y matrix; they number i in the column direction and j in the row direction. Each of the respective memory cells M11 to Mij comprises the control gate CG, the floating gate FG, the erase gate EG, the drain D and the source S. The drains of the memory cells in the same column are commonly connected to the digit lines DL1 to DLj, respectively. The sources of the respective memory cells are grounded. The control gates of the memory cells arranged in one row are commonly connected to row lines RL1 to RLi, respectively. A column address is input to the column decoder 150, one output end of which is selected according to this column address when reading out or writing data. Then, a high voltage such as +5V or +20V is applied from the selected output end and low voltages such as 0V are output from the nonselected output ends. A row address is input to the row decoder 152, one output end of which is selected according to this row address when reading out or writing data. Then, a high voltage is output from the selected output end and low voltages are output from all the nonselected output ends. The digit lines DL1 to DLj are connected to output ends CD1 and CDj of the column decoder 150 through MOS transistors Tc1 to Tcj, respectively. Erase lines E1 to Ej are connected to the erase terminal Er for erasing data through resistors Re1 to Rej, respectively. The erase lines E1 to Ej are grounded through MOS transistors Tre1 to Trej. The output ends CD1 to DCj of the column decoder 150 are connected to the gates of the transistors Tre1 to Trej through inverters I1 to Ij, respectively. The gates of the transistors Tc1 to Tcj are commonly connected to a terminal CVprog. Row lines RL1 to RLi are connected to output ends RD1 to RDi of the row decoder 152 through the MOS transistors Tr1 to Tri, respectively. The gates of the transistors Tr1 to Tri are commonly connected to the terminal CVprog. The row lines RL1 to RLi are connected to one end each of MOS transistors Trp1 to Trpi, the other ends of which are respectively grounded through MOS transistors Q1 to Qi as well as connected to the terminal Er through resistors RR1 to RRi. The gates of the transistors $\overline{\text{Trp1}}$ to Trpi are commonly connected to a terminal $\overline{\text{CVprog}}$ to which inverted signals of the signals input to the terminal CVprog are input. The gates of the transistors Q1 to Qi are respectively connected to the terminals RD1 to RDi. For erasing data, a data erase voltage, for example, +40V is applied to the terminal Er.

The mode of operation of the semiconductor memory device will now be described which is capable of selecting memory cells in units of bits and erasing data in units of bits. During writing, the terminal CVprog is at high level, and the terminal $\overline{\text{CVprog}}$ is at low level. Therefore, the transistors Tr1 to Tri are turned on, transistors Tc1 to Tcj are turned on, the transistors Trp1 to Trpi are turned off, and the transistors Tre1 to Trei are turned off. Then, the output of the row decoder 152 is input to the row lines RL1 to RLi, and the output of the column decoder 150 is input to the digit lines DL1 to DLj. If the memory cell Mij is selected, the row line RLi is at high level, and the digit line DLj is at high level so that a program voltage is applied to the memory cell Mij. Therefore, the electrons are injected into the floating gate of the memory cell Mij, and the threshold voltage of this memory cell is raised, thus completing the writing.

Erasing of data only in the memory cell Mij, for example, will now be described. During erasing, the terminal CVprog is at low level, and the terminal $\overline{\text{CVprog}}$ is at high level. Since the transistors Tr1 to Tri are turned off, the output of the row decoder 152 is not directly input to the row lines RL1 to RLi. However, since the transistors Trp1 to Trpi are turned on, the high voltage from the erase terminal Er is decoded by the row decoder 152. In other words, when the memory cell Mij is selected, the output end RDi alone of the row decoder 152 is at high level, and all the remaining output ends RD1 to RD(i−1) are at low level. Therefore, since the transistor Qi alone is turned on, the row line RLi alone is at low level, that is, 0V, and a high voltage, that is, the voltage applied to the erase terminal Er is input to all the remaining row lines RL1 to RL(i−1). The high voltage applied to the terminal $\overline{\text{CVprog}}$ is preferably at a higher level (e.g., +45V) than the voltage level applied to the erase terminal Er. Consequently, the selected row line is at low level and the nonselected row lines are at high level during erasing.

The mode of operation of the circuit including the column decoder 150 will now be described. Since the terminal CVprog is at low level as has been described above, the transistors Tc1 to Tcj are turned off, and the output from the column decoder 150 is input to the gates of the transistors Tre1 to Trej through the inverters I1 to Ij, respectively. Since the memory cell Mij has been selected, the output CDj alone of the column decoder 150 becomes high level. Then, the transistor Trej alone is turned off, and the high voltage applied to the terminal Er is applied to the erase line Ej alone. On the other hand, the high voltage is applied to the control gates of the memory cells M1j to M(i−1)j. The potentials at the floating gates of the memory cells M1j to M(i−1)j may made high by increasing the coupling capacitances of the floating gates and the control gates of the memory cells. Therefore, the field emission is not caused between the floating gates and the erase gates of the memory cells M1j to M(i−1)j even when the high voltage is applied to the erase gates of the memory cells M1j to M(i−1)j. On the other hand, since the potential of the control gate of the memory cell Mij is low level, that is, 0V, the potential of the floating gate of the memory cell Mij is about 0V even if the coupling capacitance between the control gate and the floating gate is great. Therefore the high voltage applied to the erase line Ej is directly applied across the floating gate and the erase gate so that the electrons are discharged from the floating gate of the memory cell Mij alone by the field emission.

When the coupling capacitance between the floating gate and the control gate of each memory cell of the semiconductor memory device described above is great, the floating gate becomes at +30V if a high voltage, for example, +40V is applied to the control gate. Therefore, the potential difference between the erase gate and the floating gate becomes 10V so that the electrons are not emitted to the outside from the floating gate.

The structural conditions of the semiconductor memory device will be obtained for effectively emitting the electrons from the floating gate of the selected memory cell by the field emission and for not emitting the electrons from the nonselected memory cells. The charge $-Q_F$ stored in advance on the floating gate may be given by the following relation:

$$-Q = C_{FB} \cdot V_F + C_{FE}(V_F - V_E) + C_{FC}(V_F - V_C) = (C_{FB} + C_{FE} + C_{FC})V_F - C_{FE} \cdot V_E - \cdot V_C \quad (4)$$

where $C_{FE}$ is the capacitance between the floating gate and the erase gate, $C_{FC}$ is the capacitance between the floating gate and the control gate, $C_{FB}$ is the capacitance between the floating gate and the source region, the substrate region and the drain region, $V_F$ is the floating gate voltage, $V_E$ is the erase gate voltage, and $V_C$ is the control gate voltage, $V_B$ is the substrate voltage (where $V_B = 0V$).

The potential at the floating gate may be obtained from relation (4) as follows:

$$V_F = (-Q_F + C_{FE} \cdot V_E + C_{FC} V_C)/C_T \quad (5)$$

where $C_T = C_{FB} + C_{FE} + C_{FC}$.

The potential difference $V_{EF}$ across the floating gate and the erase gate may be given by the following relation:

$$V_{EF} = V_E - V_F = [(C_{FB} + C_{FC})V_E + Q_F + Q_F - C_{FC} \cdot V_C]/C_T \quad (6)$$

When the control gate voltage $V_C$ is set at 0V for erasing the data in a memory cell. In this case, the potential difference $V_{EF1}$ across the floating gate and the erase gate of this memory may be given by the following relation:

$$V_{EF1}(V_C = 0) = [(C_{FB} + C_{FC})V_E + Q_F]/C_T \quad (7)$$

When the control gate voltage $V_C$ is set at $V_E V$ so as not to perform erasing at the remaining memory cells, the potential difference $V_{EF2}$ across the floating gate and the erase gate of each of these memory cells may be given by the following relation:

$$V_{EF2}(V_C = V_F) = (C_{FB} \cdot V_E + Q_F)/C_T \quad (8)$$

The ratio of the potential differences in relations (7) and (8) may be given by the following relation:

$$V_{EF1}/V_{EF2} = [(C_{FB} + C_{FC})V_E + Q_F]/(C_{FB} \cdot V_E + Q_F) \quad (9)$$

If it is assumed that $|C_{FB} \cdot V_E| > Q_F$, relation (9) may be approximated as follows:

$$V_{EF1}/V_{EF2} = (C_{FB} + C_{FC})/C_{FB} = C_{FC}/C_{FB} = 1 + C_{FC}/C_{FB} \quad (10)$$

In order to effectively erase the data in a selected memory cell and not to erase data in the nonselected memory cells, the value of the relation (10) must be 3 or more. Therefore, it suffices to satisfy the relation:

$$C_{FC} \geq 2C_{FB} \quad (11)$$

As in the case of the semiconductor memory device as shown in FIG. 29, the charge $-Q_F$ injected and stored on the floating gate of the memory cell may be quantitatively detected by using the terminal Er for erasing data.

In other words, the charge $-Q_F$ may be quantitatively detected by varying the voltage $V_E$ using relation (2).

The conditions for detecting the charge $-Q_F$ without erasing data will now be obtained. First, from relation (5) above is obtained the following relation:

$$0 = (C_{FE} \cdot \partial V_E + C_{FC} \cdot \partial V_C)/C_T \quad (12)$$

Therefore, we obtain $$\partial V_E \partial V_C = -(C_{FC}/C_{FE}) \quad (13)$$

Data will not be erased if $C_{FC}/C_{FE} \leq 5$. Consequently, we obtain $$C_{FC} \leq 5C_{FE} \quad (14)$$

From the condition described above (relation (14)) and the condition (relation (11)) for erasing data, if the relation $$5C_{FE} \geq C_{FC} \geq 2C_{FB} \quad (15)$$

is satisfied, the writing condition of the data in the memory cell may be quantitatively detected while efficiently erasing data in a selected memory cell and not erasing the data in the nonselected memory cells.

If relations $$C_{FC} \geq C_{FE} \geq C_{FC}/5$$

$$5C_{FE} \geq C_{FC} \geq 2C_{FB}$$

are satisfied from relations (3) and (15), the writing efficiency in memory cells may be kept well while ensuring that the data of a selected memory cell alone may be efficiently erased and the data in the nonselected memory cells may not be erased, and allowing quantitative detection of the writing condition of the data in the memory cells.

What is claimed is:

1. A semiconductor memory device with a plurality of memory cells arranged in a matrix form, each of said memory cells comprising:

a semiconductor region of a first conductivity type;

source and drain regions of a second conductivity type formed in said semiconductor region;

a gate insulation film formed on a part of said semiconductor region between said source and drain regions;

a field insulation film, formed on said semiconductor region, for separating each memory cell from the other memory cells;

an erase gate formed over said field insulation film;

a floating gate formed on said gate insulation film and extending over said field insulation film, a portion of said floating gate, which is formed over said field insulation film, overlapping a part of said erase gate, said floating gate being arranged symmetrically about said erase gate, and said erase gate of one of said memory cells being commonly formed for a plurality of said memory cells, floating gate;

a first insulating film interposed between said floating gate and said erase gate;

a control gate formed over said floating gate and said erase gate;

a second insulating film interposed between said control gate and said floating gate; and a third insulating film interposed between said control gate and said erase gate;

whereby said control gate is insulated from said erase gate and said floating gate, and wherein said portion of said floating gate overlapping said part of said erase gate is provided between said field insulation film and said control gate.

2. A semiconductor memory device according to claim 1, wherein said floating and control gates are formed over a substrate region where a channel is formed between said source and drain regions, said floating gate having a width smaller than the channel length between said source and drain regions, and said control gate having a width not smaller than the channel length.

3. A semiconductor memory device with a plurality of memory cells arranged in a matrix form, each of said memory cells comprising:
 a semiconductor region of a first conductivity type;
 source and drain region of a second conductivity type formed in said semiconductor region;
 a gate insulation film formed on a part of said semiconductor region between said source and drain regions;
 a field insulation film, formed on said semiconductor region, for separating each memory cell from the other memory cells;
 an erase gate formed over said field insulation film;
 a floating gate formed on said gate insulation film and extending over said field insulation film, a portion of said floating gate, which is formed over said field insulation film, overlapping a part of said erase gate;
 a first insulating film interposed between said floating gate and said erase gate;
 a control gate formed over said floating gate and said erase gate;
 a second insulating film interposed between said control gate and said floating gate; and
 a third insulating film interposed between said control gate and said erase gate;
 whereby said control gate is insulated from said erase gate and said floating gate,
 wherein said erase gate is an island surrounded by a fourth insulating film and is connected to a wiring layer, and
 wherein said portion of said floating gate overlapping said part of said erase gate is provided between said field insulation film and said control gate.

4. A semiconductor memory device according to claim 3, wherein said floating and control gates are formed over a substrate region where a channel is formed between said source and drain regions, said floating gate having a width smaller than the channel length between said source and drain regions, and said control gate having a width not smaller than the channel length.

5. A semiconductor memory device according to claim 3 or 4, wherein said field insulation film is thicker than said gate insulation film.

6. A semiconductor memory device according to claim 5, wherein said portion of said floating layer is formed above said part of said erase gate 7. A semiconductor memory device according to claim 6, wherein said field insulation film is thicker than said first insulating film.

8. A semiconductor memory device according to claim 5, wherein said part of said erase gate is formed above said portion of said floating gate 9. A semiconductor memory device according to claim 3, wherein said erase gate and said floating gate ar both made of polycrystalline silicon.

10. A semiconductor memory device according to claim 3, wherein said erase gate and said floating gate are both made of molybdenum.

11. A semiconductor memory device according to claim 3 or 4, wherein a relation $C_{FC} > C_{FE} \geq C_{FC}/5$ is satisfied, where $C_{FE}$ is a capacitance between said erase gate and said floating gate and $C_{FC}$ is a capacitance between said floating gate and said control gate.

12. A semiconductor memory device according to claim 3 or 4, wherein electrons are emitted from said floating gate by the field emission only if a potential at said control is low level, and wherein charge stored on said floating gate may be quantitatively detected by varying the potential at said erase gate.

13. A semiconductor memory device according to claim 12, wherein a relation $C_{FE} > C_{FC} \geq C_{FC}/5$ is satisfied, where $C_{FE}$ is a capacitance between said erase gate and said floating gate and $C_{FC}$ is a capacitance between said floating gate and said control gate.

14. A semiconductor memory device according to claim 12, wherein a relation $5C_{FE} > C_{FC} \geq 2C_{FB}$ is satisfied, where $C_{FE}$ is a capacitance between said erase gate and said floating gate, and $C_{FB}$ is a capacitance between said floating gate and said semiconductor region.

15. A semiconductor memory device according to claim 14, wherein the capacitance $C_{FE}$ and the capacitance $C_{FC}$ satisfy a relation $C_{FC} > C_{FE} \geq C_{FC}/5$.

16. A semiconductor memory device according to claim 3, wherein said erase gate of one of said memory cells is commonly formed for a plurality of said memory cells' floating gates.

17. A semiconductor memory device according to claim 16, wherein said floating and control gates are formed over a substrate region where a channel is formed between said source and drain regions, said floating gate has a width smaller than the channel length between said source and drain regions, and said control gate has a width not smaller than the channel length.

18. A semiconductor memory device according to claim 16 or 17, wherein said floating gate is arranged symmetrically about said erase gate.

19. A semiconductor memory device according to claim 16 or 17, wherein said field insulation film is thicker than said gate insulation film.

20. A semiconductor memory device according to claim 19, wherein said portion of said floating layer is formed above said part of said erase gate 21. A semiconductor memory device according to claim 20, wherein said field insulation film is thicker than said first insulating film.

22. A semiconductor memory device according to claim 19, wherein said part of said erase gate is formed above said portion of said floating gate 23. A semiconductor memory device according to claim 16, where said erase gate and said floating gate are both made of polycrystalline silicon.

24. A semiconductor memory device according to claim 16, wherein said erase gate and said floating gate are both made of molybdenum.

25. A semiconductor memory device according to claim 16 or 17, wherein a relation $C_{FC} > C_{FE} \geq C_{FC}/5$ is satisfied, where $C_{FE}$ is a capacitance between said erase gate and said floating gate and $C_{FC}$ is a capacitance between said floating gate and said control gate.

26. A semiconductor memory device according to claim 16 or 17, wherein electrons are emitted from said floating gate by the field emission only if a potential at said control gate is at a low level, and wherein charge stored on said floating gate may be quantitatively detected by varying the potential at said erase gate.

27. A semiconductor memory device according to claim 16, wherein a relation $C_{FE}=C_{FC}/5$ is satisfied, where $C_{FE}$ is a capacitance between said erase gate and said floating gate and $C_{FC}$ is a capacitance between said floating gate and said control gate.

28. A semiconductor memory device according to claim 26, wherein a relation $5C_{FE}=C_{FC}=2C_{FB}$ is satisfied, where $C_{FE}$ is a capacitance between said erase gate and said floating gate and $C_{FC}$ is a capacitance between said floating gate and said control gate, and $C_{FB}$ is a capacitance between said floating gate and said semiconductor region.

29. A semiconductor memory device according to claim 28, wherein the capacitance $C_{FE}$ and the capacitance $C_{FC}$ satisfy a relation $C_{FC}>C_{FE}\geq C_{FC}/5$.

* * * * *

UNITED STATES PATENT AND TRADEMARK OFFICE
CERTIFICATE OF CORRECTION

PATENT NO. : 4,803,529
DATED : February 07, 1989
INVENTOR(S) : Fujio Masuoka

It is certified that error appears in the above-identified patent and that said Letters Patent is hereby corrected as shown below:

Claim 1, Column 20, Line 57, change "cells," to --cells'--;

Claim 3, Column 21, Line 16, change "region" to --regions--.

Signed and Sealed this

Third Day of November, 1992

Attest:

DOUGLAS B. COMER

Attesting Officer

Acting Commissioner of Patents and Trademarks